US012598890B2

(12) United States Patent     (10) Patent No.: US 12,598,890 B2

Gwon et al.     (45) Date of Patent: Apr. 7, 2026

(54) DISPLAY DEVICE

(71) Applicant: LG Display Co., Ltd., Seoul (KR)

(72) Inventors: Hyangmyoung Gwon, Paju-si (KR); JiHyun Jung, Paju-si (KR); SuChang An, Paju-si (KR); JaeGyun Lee, Paju-si (KR); Ruda Rhe, Paju-si (KR); DeukSu Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/958,461

(22) Filed: Nov. 25, 2024

(65) Prior Publication Data

US 2025/0275413 A1    Aug. 28, 2025

(30) Foreign Application Priority Data

Feb. 27, 2024    (KR) ........................ 10-2024-0027955

(51) Int. Cl.
| | |
|---|---|
| *H10K 59/40* | (2023.01) |
| *G06F 3/041* | (2006.01) |
| *G06F 3/044* | (2006.01) |
| *H10K 59/121* | (2023.01) |
| *H10K 59/80* | (2023.01) |

(52) U.S. Cl.
CPC ......... *H10K 59/40* (2023.02); *G06F 3/04164* (2019.05); *G06F 3/0446* (2019.05); *H10K 59/1213* (2023.02); *H10K 59/873* (2023.02); *H10K 59/879* (2023.02)

(58) Field of Classification Search
CPC .. H10K 59/40; H10K 59/1213; H10K 59/873; H10K 59/879; G06F 3/04164; G06F 3/0446
See application file for complete search history.

(56) References Cited

U.S. PATENT DOCUMENTS

| | | | | |
|---|---|---|---|---|
| 12,082,441 | B2 * | 9/2024 | Lee ...................... | H10K 59/879 |
| 2016/0064694 | A1 * | 3/2016 | Choi ...................... | H10K 59/38 |
| | | | | 257/40 |
| 2017/0163975 | A1 * | 6/2017 | Jin .......................... | G02B 30/28 |
| 2020/0343311 | A1 * | 10/2020 | Li ...................... | G06V 40/1318 |
| 2022/0190295 | A1 * | 6/2022 | Son ................... | H10K 59/80517 |
| 2023/0109163 | A1 * | 4/2023 | Kim ...................... | H10K 50/868 |
| | | | | 257/40 |
| 2023/0113069 | A1 * | 4/2023 | Baek ..................... | H10K 59/879 |
| | | | | 257/91 |
| 2024/0047503 | A1 * | 2/2024 | Saito ...................... | H10F 39/811 |
| 2024/0220043 | A1 * | 7/2024 | Han ...................... | G06F 3/0443 |
| 2024/0298508 | A1 * | 9/2024 | Wang ................... | H10K 59/879 |
| 2024/0389440 | A1 * | 11/2024 | Shim ................... | G06F 3/0443 |
| 2025/0098497 | A1 * | 3/2025 | Kim ...................... | H10K 59/40 |
| 2025/0143143 | A1 * | 5/2025 | Bang ................... | H10K 59/8731 |

\* cited by examiner

*Primary Examiner* — Amy Onyekaba

(74) *Attorney, Agent, or Firm* — Birch, Stewart, Kolasch & Birch, LLP

(57) ABSTRACT

A display device may include a substrate, an encapsulation layer disposed on the substrate, a metal barrier including an opening area and constituting a touch electrode, and a first lens disposed to overlap with the opening area of the metal barrier, thereby providing a touch detection function.

10 Claims, 27 Drawing Sheets

DISPLAY DEVICE

CROSS-REFERENCE TO RELATED APPLICATION

This application claims priority to Korean Patent Application No. 10-2024-0027955, filed in the Republic of Korea on Feb. 27, 2024, the entire contents of which are hereby expressly incorporated by reference for all purposes as if fully set forth herein into the present application.

BACKGROUND

Field

Embodiments of the present disclosure relate to a display device.

Discussion of the Related Art

As the information society develops, a demand for display devices for displaying images in various forms is increasing. Therefore, in recent years, there have been used various display devices such as liquid crystal displays and organic light emitting display devices.

A display device can include touch sensors, and the display device can recognize a touch operation of a user.

SUMMARY OF THE DISCLOSURE

Embodiments of the present disclosure can provide a display device with a touch detection function.

Embodiments of the present disclosure can provide a display device having a thin display panel with a touch detection function.

Embodiments of the present disclosure can provide a display device having a new touch structure.

Embodiments of the present disclosure can provide a display device capable of detecting a touch with low power.

Embodiments of the present disclosure can provide a display device including a substrate, an encapsulation layer disposed on the substrate, a metal barrier including an opening area, and constituting a touch electrode, and a first lens disposed to overlap with the opening area of the metal barrier.

According to embodiments of the present disclosure, it is possible to provide a display device with a touch detection function.

According to embodiments of the present disclosure, it is possible to provide a display device having a thin display panel with a touch detection function.

According to embodiments of the present disclosure, it is possible to provide a display device having a new touch structure.

According to embodiments of the present disclosure, it is possible to provide a display device capable of detecting a touch with low power.

BRIEF DESCRIPTION OF THE DRAWINGS

FIGS. 14 and 15 illustrate a touch electrode according to embodiments of the present disclosure.

DETAILED DESCRIPTION OF THE EMBODIMENTS

Figure 1:
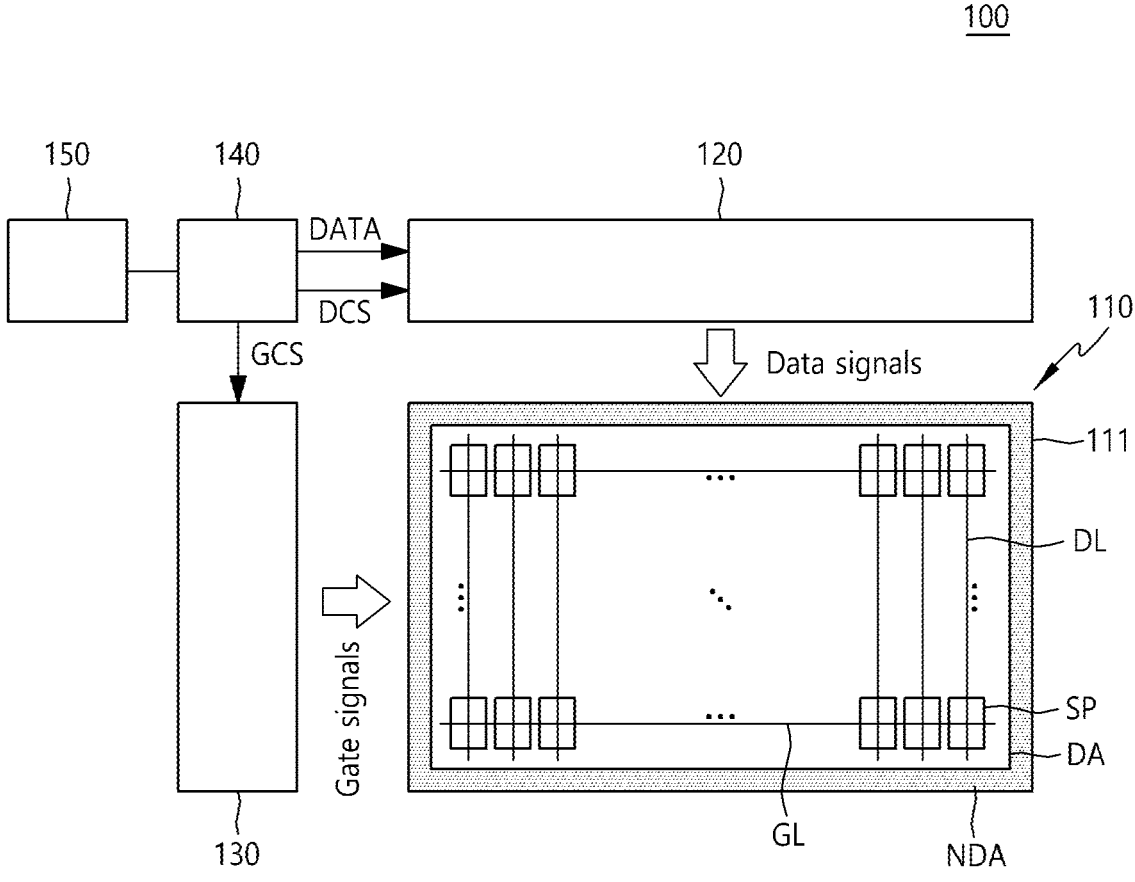
FIG. 1 is a system configuration diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise. Further, the term "can" fully encompasses all the meanings and coverages of the term "may."

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings. All the components of each display device according to all embodiments of the present disclosure are operatively coupled and configured.

FIG. 1 is a system configuration diagram of a display device 100 according to embodiments of the present disclosure.

Referring to FIG. 1, a display device 100 according to embodiments of the present disclosure can include a display panel 110 and a display driving circuit as components for displaying an image. The display driving circuit is a circuit for driving the display panel 110, and can include a data driving circuit 120, a gate driving circuit 130, and a display controller 140.

The display panel 110 can include a substrate 111 and a plurality of subpixels SP disposed on the substrate 111.

The substrate 111 of the display panel 110 can include a display area DA capable of displaying an image and a non-display area NDA located outside the display area DA. The non-display area NDA can surround the display area DA entirely or only in part(s).

A plurality of subpixels SP for image display can be disposed in the display area DA, and the non-display area NDA can include a pad area PA located in the first direction from the display area DA.

In a display panel 110 according to embodiments of the present disclosure, the non-display area NDA can be very small. In this specification, the non-display area NDA can be also referred to as a "bezel."

For example, the non-display area NDA can include a first non-display area located outside the display area DA in a first direction, a second non-display area located outside the display area DA in a second direction intersecting the first direction, a third non-display area located outside the display area DA in the opposite direction to the first direction, and a fourth non-display area located outside the display area DA in the direction opposite to the second direction.

One or both of the first to fourth non-display areas can include a pad area to which the data driving circuit 120 is connected or bonded. Among the first to fourth non-display areas, two or three which do not include the pad area can be very small in size.

For another example, a boundary area between the display area DA and the non-display area NDA can be bent so that the non-display area NDA can be located below the display area. In this case, when the user looks at the display device 100 from the front, there can be little or no non-display area NDA visible to the user.

Various types of signal lines for driving a plurality of subpixels SP can be disposed on the substrate 111 of the display panel 110.

The display device 100 according to embodiments of the present disclosure can be a liquid crystal display device or the like, or can be a self-luminous display device in which the display panel 110 emits light by itself. When the display device 100 according to embodiments of the present disclosure is a self-luminous display device, each of the plurality of subpixels SP can include a light emitting device.

For example, the display device according to embodiments of the present disclosure can be an organic light emitting display device in which a light emitting device is implemented as an organic light emitting diode (OLED). For another example, the display device 100 according to embodiments of the present disclosure can be an inorganic light emitting display device in which the light emitting device is implemented as an inorganic-based light emitting diode. For another example, the display device 100 according to embodiments of the present disclosure can be a quantum dot display device in which a light emitting device is implemented with quantum dots, which are semiconductor crystals emitting light by itself.

The structure of each of the plurality of subpixels SP can vary depending on the type of the display device 100. For example, if the display device 100 is a self-luminous display device with the subpixel SP emitting light by itself, each subpixel SP can include a self-luminous light emitting device, one or more transistors, and one or more capacitors.

For example, various types of signal lines can include a plurality of data lines DL supplying data signals (also called data voltages or image signals) and a plurality of gate lines GL for transmitting gate signals (also called scan signals).

For example, the plurality of data lines DL and the plurality of gate lines GL can cross each other. Each of the plurality of data lines DL can be arranged to extend in a first direction. Each of the plurality of gate lines GL can be arranged to extend in a second direction. Here, the first direction can be a column direction and the second direction can be a row direction. Alternatively, the first direction can be a row direction and the second direction can be a column direction. Hereinafter, for convenience of explanation, it will exemplified a case in which each of the plurality of data lines DL is arranged in a column direction, and each of the plurality of gate lines GL is arranged in a row direction.

The data driving circuit 120 is a circuit for driving a plurality of data lines DL, and can output data signals to the plurality of data lines DL.

The data driving circuit 120 can receive image data in digital form from the display controller 140 and convert the received image data into analog data signals to output to a plurality of data lines DL.

For example, the data driving circuit 120 can be connected to the display panel 110 using a tape automated bonding (TAB) method, or can be connected to the bonding pad of the display panel 110 using a chip-on-glass (COG) or chip-on-panel (COP) method, or can be implemented using a chip-on-film (COF) method and connected to the display panel 110.

The data driving circuit 120 can be connected to one side (e.g., the upper or lower side) of the display panel 110. Depending on the driving method, panel design method, etc., the data driving circuit 120 can be connected to both sides (e.g., upper and lower sides) of the display panel 110, or can be connected to two or more of the four sides of the display panel 110.

The data driving circuit 120 can be connected to the outside of the display area DA of the display panel 110, but alternatively, it can be disposed in the display area DA of the display panel 110.

The gate driving circuit 130 is a circuit for driving a plurality of gate lines GL, and can output gate signals to the plurality of gate lines GL.

The gate driving circuit 130 can receive a first gate voltage corresponding to the turn-on level voltage and a second gate voltage corresponding to the turn-off level voltage along with various gate driving control signals GCS, and can generate gate signals and supply the generated gate signals to the plurality of gate lines GL.

In the display device 100 according to embodiments of the present disclosure, the gate driving circuit 130 can be built into the display panel 110 as a gate-in-panel (GIP) type. If the gate driving circuit 130 is a gate-in-panel type, the gate driving circuit 130 can be formed on a substrate of the display panel 110 during the manufacturing process of the display panel 110.

In the display device 100 according to embodiments of the present disclosure, the gate driving circuit 130 can be disposed in the display area DA of the display panel 110. For example, the gate driving circuit 130 can be disposed in a first partial area within the display area DA (e.g., a left area or a right area within the display area DA). For another example, the gate driving circuit 130 can be disposed in a first partial area within the display area DA (e.g., a left area or a right area within the display area DA) and a second partial area (e.g., a right area or a left area within the display area DA).

In the present disclosure, a gate driving circuit 130 built into the display panel 110 as a gate-in-panel type can be referred to as a "gate-in-panel circuit."

The display controller 140 can be a device for controlling the data driving circuit 120 and the gate driving circuit 130, and can control the driving timing for the plurality of data lines DL and the driving timing of the plurality of gate lines GL.

The display controller 140 can supply a data driving control signal DCS to the data driving circuit 120 to control the data driving circuit 120, and can supply a gate driving control signal GCS to the gate driving circuit 130 to control the gate driving circuit 130.

The display controller 140 can receive input image data from a host system 150 and supply image data DATA to the data driving circuit 120 based on the input image data.

The display controller 140 can be implemented as a separate component from the data driving circuit 120, or can be integrated with the data driving circuit 120 and implemented as an integrated circuit.

The display controller 140 can be a timing controller used in typical display technology, or can be a control device capable of further performing other control functions including a timing controller, or can be a control device different from the timing controller, or can be a control device other than a timing controller, or can be a circuit within the control device. The display controller 140 can be implemented with various circuits or electronic components, such as an integrated circuit (IC), a field programmable gate array (FPGA), an application specific integrated circuit (ASIC), or Processor.

The display controller 140 can be mounted on a printed circuit board, a flexible printed circuit, etc., and can be electrically connected to the data driving circuit 120 and the gate driving circuit 130 through a printed circuit board, a flexible printed circuit.

The display controller 240 can transmit and receive signals with the data driving circuit 120 according to one or more predetermined interfaces. For example, the interface can include a low voltage differential signaling (LVDS) interface, an embedded clock point-point interface (EPI) interface, or a serial peripheral interface (SPI).

In order to provide not only an image display function but also a touch sensing function, the display device 100 according to embodiments of the present disclosure can include a touch sensor and a touch sensing circuit for detecting an occurrence of a touch by a touch object such as a finger or pen or detection a touch position by sensing the touch sensor.

The touch sensing circuit can include a touch driving circuit for driving and sensing a touch sensor to generate and output touch sensing data, and a touch controller for detecting the occurrence of a touch or detecting the touch position using touch sensing data.

The touch sensor can include a plurality of touch electrodes. The touch sensor can further include a plurality of touch lines to electrically connect a plurality of touch electrodes and the touch driving circuit.

The touch sensor can exist outside the display panel 110 in the form of a touch panel or can exist inside the display panel 110. If the touch sensor exists outside the display panel 110 in the form of a touch panel, the touch sensor can be referred to as an external type. If the touch sensor is an external type, the touch panel and the display panel 110 can be manufactured separately and combined during the assembly process. The external touch panel can include a touch panel substrate and a plurality of touch electrodes on the touch panel substrate.

If the touch sensor exists inside the display panel 110, the touch sensor can be formed on the substrate along with signal lines and electrodes related to display driving during the manufacturing process of the display panel 110.

The touch driving circuit can supply a touch driving signal to at least one of the plurality of touch electrodes and generate touch sensing data by sensing at least one of the plurality of touch electrodes.

The touch sensing circuit can perform touch sensing using a self-capacitance sensing method or a mutual-capacitance sensing method.

If the touch sensing circuit performs touch sensing using a self-capacitance sensing method, the touch sensing circuit can perform touch sensing based on the capacitance between each touch electrode and a touch object (e.g., finger, pen, etc.). According to the self-capacitance sensing method, each of the plurality of touch electrodes can serve as a driving touch electrode and a sensing touch electrode. The touch driving circuit 260 can drive all or part of the plurality of touch electrodes and sense all or part of the plurality of touch electrodes.

If the touch sensing circuit performs touch sensing using the mutual-capacitance sensing method, the touch sensing circuit can perform touch sensing based on the capacitance between touch electrodes. According to the mutual-capacitance sensing method, the plurality of touch electrodes can be divided into driving touch electrodes and sensing touch electrodes. The touch driving circuit can drive driving touch electrodes and sense sensing touch electrodes.

The touch driving circuit and the touch controller included in the touch sensing circuit can be implemented as separate devices or as one device. Additionally, the touch driving circuit and the data driving circuit can be implemented as separate devices or as one device.

The display device 100 can further include a power supply circuit which supplies various types of power to the display driving circuit and/or the touch sensing circuit.

The display device 100 according to embodiments of the present disclosure can be a mobile terminal such as a smart phone or tablet, or a monitor or television of various sizes, but is not limited thereto, and can be a display of various types and sizes capable of displaying information or images.

The display device 100 according to embodiments of the present disclosure can further include an electronic device such as a camera (e.g., image sensor) and a detection sensor. For example, the detection sensor can be a sensor for detecting an object or a human body by receiving light such as infrared, ultrasonic, or ultraviolet rays.

Meanwhile, the light emitted through the display panel 110 can be emitted from the display panel 110 at a predetermined viewing angle. One frame image can be displayed on the display panel 110 when each of the plurality of subpixels SP emits light. If light is emitted from one subpixel SP, the light can be emitted at a predetermined angle. For example, each of the plurality of subpixels SP can emit light at a predetermined viewing angle range, such as 30 degrees, 60 degrees, 120 degrees, or 150 degrees. In the case that the viewing angle is n degrees (n is a natural number greater than or equal to 1), the left side can be n/2 degrees and the right side can be n/2 degrees based on the front from which light is emitted. If the viewing angle is relatively large, there can be referred to as a "wide angle" or a "wide viewing angle". In addition, if the viewing angle is relatively small, there can be referred to as a "narrow angle" or a "narrow viewing angle."

The viewing angle of the display panel 110 can be fixed. In addition, the viewing angle of the display panel 110 can be variable. For example, the viewing angle of the display panel 110 can be controlled through a light control film LCF, a lens layer, or other viewing angle control structures.

As an example of one method for controlling the viewing angle of the display panel 110, one subpixel SP can include two light emitting devices. The two light emitting devices can be a first light emitting device and a second light emitting device. The first light emitting device can be a light emitting device for narrow-angle driving, and the second light emitting device can be a light emitting device for wide-angle driving. As the first light emitting device and the second light emitting device are selectively driven, the frame image can be displayed on the display panel 110 at a narrow angle or a wide angle.

Figure 2:
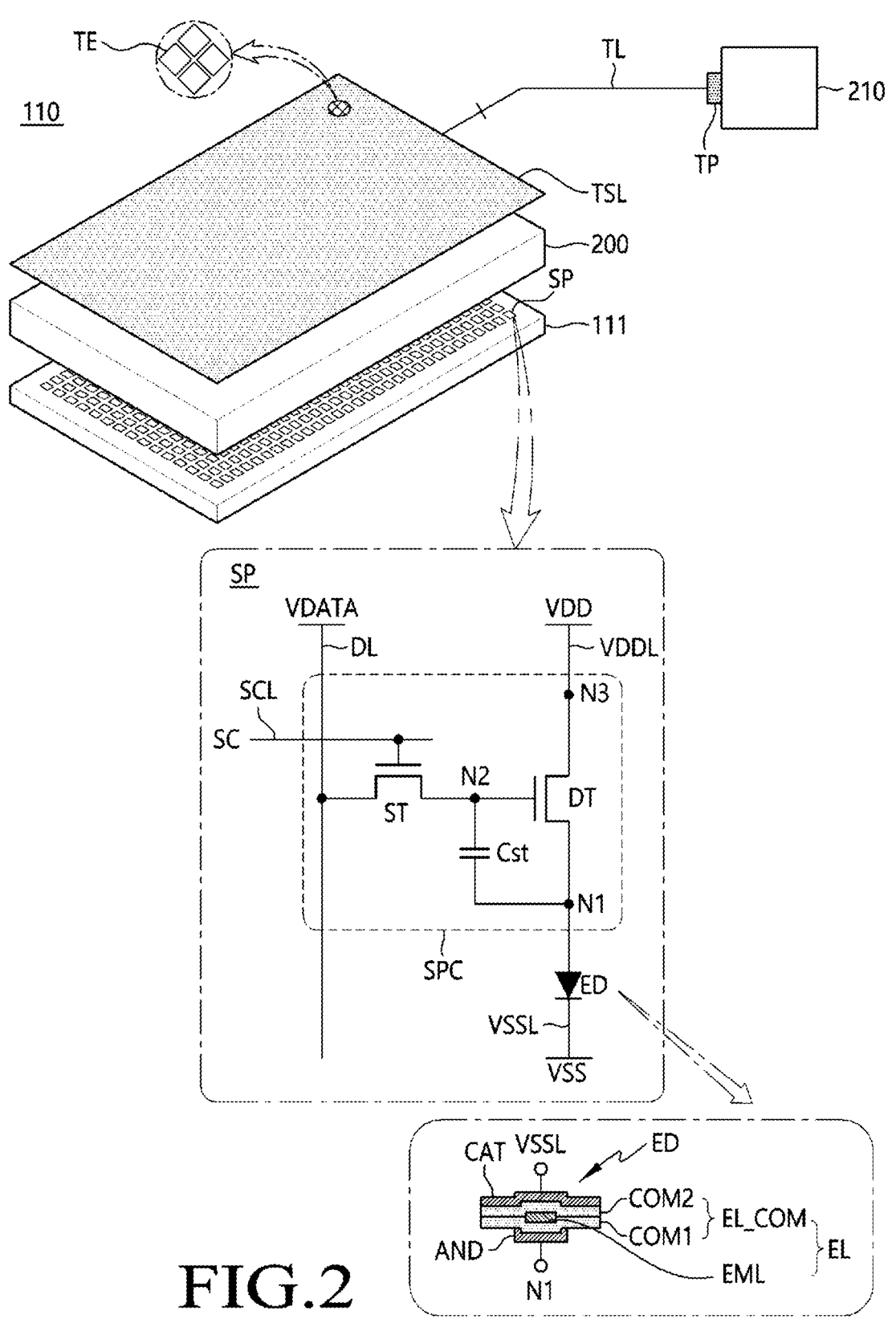
FIG. 2 illustrates a display panel according to embodiments of the present disclosure.

FIG. 2 illustrates a display panel 110 according to embodiments of the present disclosure.

Referring to FIG. 2, the display panel 110 can include a substrate 111 disposed in a plurality of subpixels SP and an encapsulation layer 200 on the substrate 111. Here, the encapsulation layer 200 can also be referred to as an encapsulation substrate or an encapsulation portion.

When the display device 100 according to embodiments of the present disclosure is a self-luminous display device, each of the plurality of subpixels SP can include a light emitting device ED and a subpixel circuit SPC for driving the light emitting device ED.

The subpixel circuit SPC can include a plurality of pixel driving transistors and at least one capacitor for driving the light emitting device ED. In the present disclosure, the subpixel circuit SPC can drive the light emitting device ED by supplying a driving current to the light emitting device ED at a predetermined timing. The light emitting device ED can be driven by a driving current and emit light.

The plurality of pixel driving transistors can include a driving transistor DT for driving the light emitting device ED, and a scan transistor ST which is turned on or off depending on the scan signal SC.

The driving transistor DT can supply driving current to the light emitting device ED.

The scan transistor ST can be configured to control the electrical state of a corresponding node in the subpixel circuit SPC or to control the state or operation of the driving transistor DT.

At least one capacitor can include a storage capacitor Cst to maintain a constant voltage during the frame.

In order to drive the subpixel SP, a data signal VDATA which is an image signal, and a scan signal SC which is a gate signal can be applied to the subpixel SP. In addition, a common pixel driving voltage including a first driving voltage VDD and a second driving voltage VSS can be applied to the subpixel SP in order to drive the subpixel SP.

The light emitting device ED can include an anode AND, a light emitting device intermediate layer EL, and a cathode CAT. The light emitting device intermediate layer EL can be a layer disposed between the anode AND and the cathode CAT.

In the case that the light emitting device ED is an organic light emitting device, the light emitting device intermediate layer EL can include an emission layer EML, a first common intermediate layer COM1 between the anode AND and the emission layer EML, and a second common intermediate layer COM2 between the emission layer EML and the cathode. The emission layer EML can be disposed in each subpixel SP. In comparison, the first common intermediate layer COM1 and the second common intermediate layer COM2 can be commonly disposed across a plurality of subpixels SP. The emission layer EML can be disposed in each emission area, and the first common intermediate layer COM1 and the second common intermediate layer COM2 can be commonly disposed across a plurality of emission areas and non-emission areas. The first common intermediate layer COM1 and the second common intermediate layer COM2 can be collectively referred to as a common intermediate layer EL COM.

For example, the first common intermediate layer COM1 can include a hole injection layer HIL and a hole transport layer HTL. The second common intermediate layer COM2 can include an electron transport layer ETL and an electron injection layer EIL. The hole injection layer can inject holes from the anode AND to the hole transport layer, the hole transport layer can transport holes to the emission EML, the electron injection layer can inject electrons from the cathode CAT to the electron transport layer, and the electron transport layer can transport electrons to the emission layer EML.

For example, the cathode CAT can be electrically connected to a second common driving voltage line VSSL. A second common driving voltage VSS, which is a type of common pixel driving voltage, can be applied to the cathode CAT through the second common driving voltage line VSSL. The anode AND can be electrically connected to a first node N1 of the driving transistor DT of each subpixel SP. In the present disclosure, the second common driving voltage VSS can also be referred to as a base voltage VSS, and the second common driving voltage line VSSL can also be referred to as a base voltage line VSSL.

For example, the anode AND can be a pixel electrode disposed in each subpixel SP, and the cathode CAT can be a common electrode commonly disposed in a plurality of subpixels SP. For another example, the cathode CAT can be a pixel electrode disposed in each subpixel SP, and the anode AND can be a common electrode commonly disposed in a plurality of subpixels SP. Hereinafter, for convenience of explanation, it is assumed that the anode AND is a pixel electrode and the cathode CAT is a common electrode.

Each light emitting device ED can be composed of overlapping parts of an anode AND, a light emitting device intermediate layer EL and a cathode CAT. A predetermined emission area can be formed by each light emitting device ED. For example, the emission area of each light emitting device ED can include an area where the anode AND, the light emitting device intermediate layer EL and the cathode CAT overlap.

For example, the light emitting device ED can be an organic light emitting diode (OLED), an inorganic light emitting diode, or a quantum dot light emitting device. For example, in the case that the light emitting device ED is an organic light emitting diode OLED, the light emitting device intermediate layer EL in the light emitting device ED can include an organic light emitting device intermediate layer EL containing an organic material.

The driving transistor DT can be a driving transistor for supplying driving current to the light emitting device ED. The driving transistor DT can be connected between a first common driving voltage line VDDL and the light emitting device ED.

The driving transistor DT can include a first node N1 electrically connected to the light emitting device ED, a second node N2 to which the data signal VDATA is applied, and a third node N3 to which the driving voltage VDD is applied from the driving voltage line DVL.

In the driving transistor DT, the second node N2 can be a gate node, the first node N1 can be a source node or a drain node, and the third node N3 can be a drain node or a source node. Hereinafter, for convenience of explanation, it will be described a case in which the second node N2 is a gate node, the first node N1 is a source node, and the third node N3 is a drain node in the driving transistor DT.

The scan transistor ST included in the subpixel circuit SPC illustrated in FIG. 2 can be a switching transistor for transmitting a data signal VDATA, which is an image signal, to the second node N2 which is the gate node of the driving transistor DT.

The scan transistor ST can be controlled on-off by the scan signal SC which is a gate signal applied through the scan line SCL as a type of gate line GL, and can control the electrical connection between the second node N2 of the driving transistor DT and the data line DL. The drain electrode or source electrode of the scan transistor ST can be electrically connected to the data line DL, and the source electrode or drain electrode of the scan transistor ST can be electrically connected to the second node N2 of the driving transistor DT. The gate electrode of the scan transistor ST can be electrically connected to the scan line SCL.

The storage capacitor Cst can be electrically connected between the first node N1 and the first node N2 of the driving transistor DT. The storage capacitor Cst can include a first capacitor electrode electrically connected to the first node N1 of the driving transistor DT or corresponding to the first node N1 of the driving transistor DT, and a second capacitor electrode electrically connected to the second node N2 of the driving transistor DT or corresponding to the second node N2 of the driving transistor DT.

The storage capacitor Cst can be an external capacitor intentionally designed outside the driving transistor DT rather than a parasitic capacitor (e.g., Cgs, Cgd) as an internal capacitor which can exist between the first node N1 and the second node N2 of the driving transistor DT.

Each of the driving transistor DT and the scan transistor ST can be an n-type transistor or a p-type transistor.

The display panel 110 can have a top emission structure or a bottom emission structure.

If the display panel 110 has a top emission structure, at least a portion of the subpixel circuit SPC can overlap with at least a portion of the light emitting device ED in the vertical direction. Alternatively, if the display panel 110 has a bottom emission structure, the subpixel circuit SPC may not overlap with the light emitting device ED in the vertical direction.

The subpixel circuit SPC can have 2T-1C structure including two transistors T1 and T2 and one capacitor Cst. In some case, the subpixel circuit SPC can further include one or more transistors or one or more capacitors.

For example, the subpixel circuit SPC can have a 8T-1C structure including eight transistors and a single capacitor. For another example, the subpixel circuit SPC can have a 6T-2C structure including six transistors and two capacitors. For another example, the subpixel circuit SPC can have a 7T-1C structure including seven transistors and one capacitor.

Depending on the structure of the subpixel circuit SPC, there can vary the type and number of gate signal and/or gate lines supplied to the subpixel SP.

In addition, depending on the structure of the subpixel circuit SPC, there can vary the type and number of common pixel driving voltages supplied to the subpixel SP.

Since circuit elements within each subpixel SP (in particular, light emitting devices EDs implemented with organic light emitting diodes (OLEDs) containing organic materials) are vulnerable to external moisture or oxygen, an encapsulation layer 200 can be disposed on the display panel 110 to prevent oxygen from penetrating into the circuit elements (particularly, the light emitting device ED). The encapsulation layer 200 can be configured in various shapes to prevent the light emitting device ED from coming into contact with moisture or oxygen.

The display device 100 according to the embodiments of the present disclosure can further include a touch sensor layer TSL including a plurality of sensor electrodes to sense a touch of an user, and a touch sensing circuit 210 configured to sense the plurality of sensor electrodes to determine the presence or absence of a touch or touch coordinates.

The touch sensor layer TSL can be built or embedded into the display panel 110. For example, the touch sensor layer TSL can be disposed on an encapsulation layer 200 within the display panel 110.

The display panel 110 may not only include the touch sensor layer TSL, but can also include a plurality of touch pads to which the touch sensing circuit 210 is electrically connected, and a plurality of touch routing lines TL for electrically connecting the plurality of sensor electrodes included in the touch sensor layer TSL and the plurality of touch pads connected to the touch sensing circuit 210.

A plurality of touch electrodes TE can be disposed on the touch sensor layer TSL. The plurality of touch electrodes TE can have a diamond shape, a rhombus shape, or a square shape, but the plurality of touch electrodes TE can also have various shapes such as a triangle, a pentagon, or a hexagon.

The touch electrode TE can be a plate-shaped touch sensor metal TSM without an opening. In this case, the touch electrode TE can be a transparent electrode. The touch electrode TE can include a transparent electrode material so that light emitted from a plurality of subpixels SP disposed below the touch electrode TE can be transmitted upward.

Figure 3:
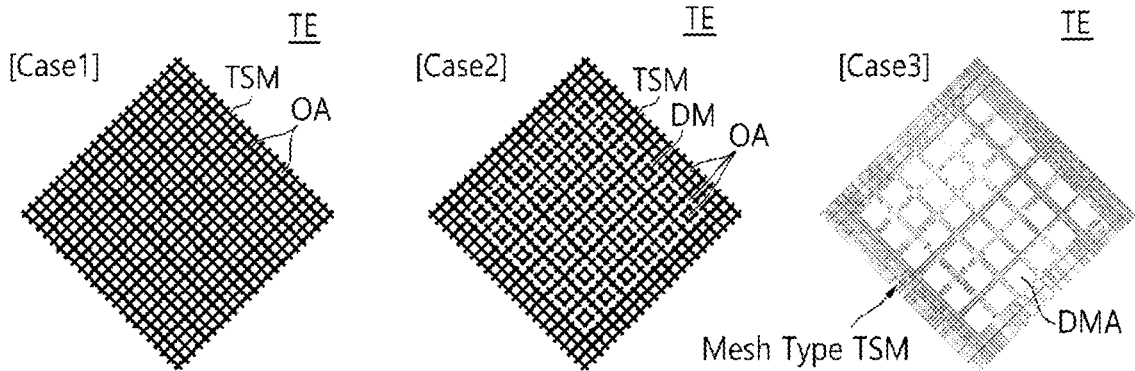
FIG. 3 illustrates various embodiments of touch electrodes according to embodiments of the present disclosure.

FIG. 3 illustrates various embodiments of a touch electrode TE according to embodiments of the present disclosure.

Unlike the touch electrode TE illustrated in FIG. 2, a touch electrode TE illustrated in FIG. 3 can include an opening area OA, a dummy metal DM, or a dummy area DMA.

Referring to FIG. 3, there is illustrated a first example (Case1). A touch electrode TE can be in a mesh shape. The touch electrode TE can be formed of a touch sensor metal TSM patterned in a mesh type to form a plurality of opening areas OA. The touch sensor metal TSM of the touch electrode TE can be a portion corresponding to the actual touch electrode TE, and can be a portion to which a touch driving signal is applied or a portion to which a touch sensing signal is detected. The touch sensor metal TSM corresponding to the touch electrode TE can be located on a bank that is disposed in an area other than the emission areas EA of the subpixels SP. The opening area OA can correspond to the emission area of the subpixel SP, or can correspond to the transmission area.

There is illustrated a second example (Case2). The touch electrode TE can include a touch sensor metal TSM in a mesh type, and one or more dummy metals DM spaced apart from the touch sensor metal TSM. The dummy metal DM can be located in an area surrounded by the touch sensor metal TSM within the area of the touch electrode TE. Unlike the touch sensor metal TSM, the dummy metal DM can be a metal that does not receive a touch driving signal and does not transmit a touch sensing signal. The touch sensor metal TSM can be electrically connected to the touch driving circuit, but the dummy metal DM may not be electrically connected to the touch driving circuit. If the touch electrode TE does not include a dummy metal DM and only includes a touch sensor metal TSM, there can be occurred a visibility issue in which the outline of the touch sensor metal TSM is visible on the screen. If a dummy metal DM is disposed, there can be prevented the visibility issue in which the outline of the touch sensor metal TSM is visible on the screen.

There is illustrated a third example (Case3). The touch electrode TE can be formed by removing a part of the inner area of the touch electrode TE. The touch electrode TE can include a dummy area DMA in which a part of the touch sensor metal TSM is removed. The dummy area DMA can have a rhombus shape, but is not limited thereto. The touch sensor metal TSM can be disposed in an outer area of the dummy area DMA, and can be disposed in a grid-like mesh type.

Figure 4:
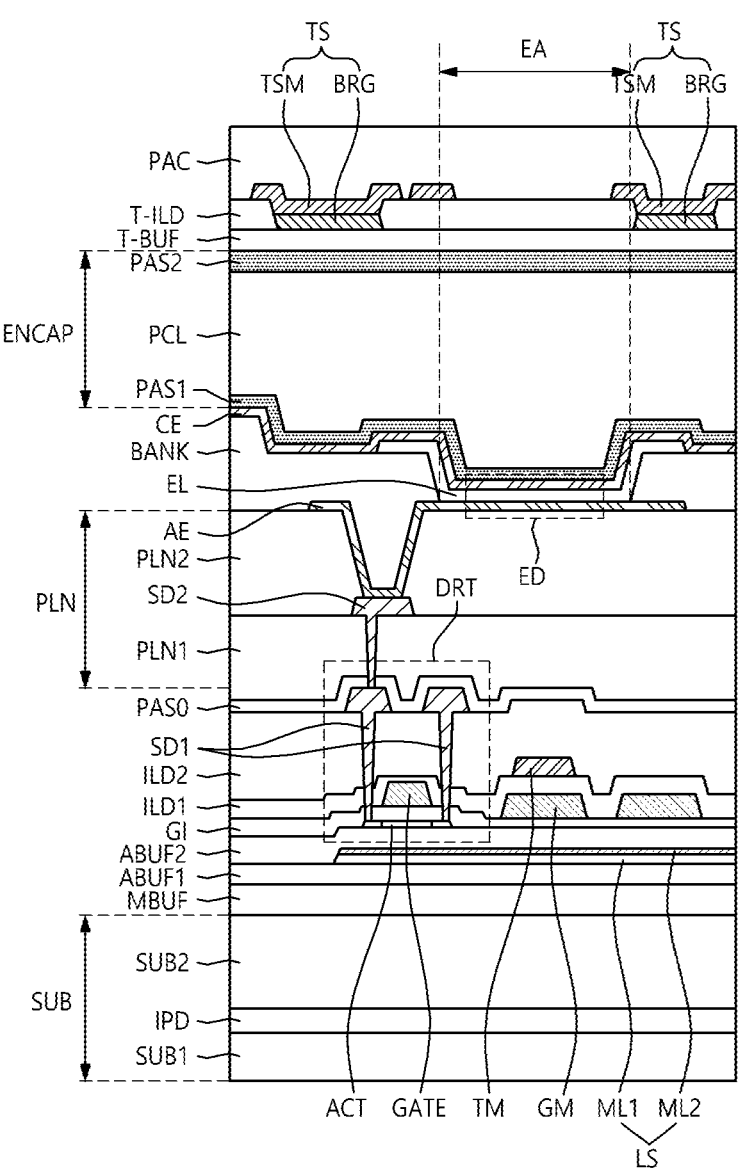
FIG. 4 is a cross-sectional view of a display area of a display panel according to embodiments of the present disclosure.

FIG. 4 is a cross-sectional view of the display area DA of the display panel 110 according to the embodiments of the present disclosure.

Referring to FIG. 4, the substrate SUB can include a first substrate SUB1, an interlayer insulating film IPD, and a second substrate SUB2. The interlayer insulating film IPD can be located between the first substrate SUB1 and the second substrate SUB2. The substrate SUB can be configured to include the first substrate SUB1, the interlayer insulating film IPD and the second substrate SUB2, thereby preventing moisture penetration. For example, the first substrate SUB1 and the second substrate SUB2 can be polyimide PI substrates. The first substrate SUB1 can be referred to as a primary PI substrate, and the second substrate SUB2 can be referred to as a secondary PI substrate.

There can be disposed various patterns (e.g., ACT, SD1, GATE1), various insulating films or insuilating layers (e.g., MBUF, ABUF1, ABUF2, GI, ILD1, ILD2, PAS0), and various metal patterns (e.g., TM1, GM, ML1, ML2) for forming transistors such as driving transistors DRT on the substrate SUB.

A multi-buffer layer MBUF can be disposed on the second substrate SUB2, and a first active buffer layer ABUF1 can be disposed on the multi-buffer layer MBUF.

A first metal layer ML1 and a second metal layer ML2 can be disposed on the first active buffer layer ABUF1. Here, the first metal layer ML1 and the second metal layer ML2 can be a light shielding layer LS capable of blocking the light.

A second active buffer layer ABUF2 can be disposed on the first metal layer ML1 and the second metal layer ML2. An active layer ACT of a driving transistor DRT can be disposed on the second active buffer layer ABUF2.

A gate insulating film GI can be disposed while covering the active layer ACT.

A first gate electrode GATE of a driving transistor DRT can be disposed on the gate insulating film GI. In this case, a gate material layer GM can be disposed on the gate insulating film GI together with the first gate electrode GATE of the driving transistor DRT at a position different from the formation position of the driving transistor DRT.

A first interlayer insulating film ILD1 can be disposed while covering the first gate electrode GATE and the gate material layer GM. A metal pattern TM1 can be disposed on the first interlayer insulating film ILD1. The metal pattern TM1 can be located at a different location from the formation location of the driving transistor DRT. A second interlayer insulating film ILD2 can be disposed while covering the metal pattern TM1 on the first interlayer insulating film ILD1.

Two first source-drain electrode patterns SD1 can be disposed on the second interlayer insulating film ILD2. One of the two first source-drain electrode patterns SD1 can be a source node of the driving transistor DRT, and the other can be a drain node of the driving transistor DRT. The two first source-drain electrode patterns SD1 can be electrically connected to one side and the other side of the active layer ACT through the contact holes of the second interlayer insulating film ILD2, the first interlayer insulating film ILD1 and the gate insulating film GI.

A portion of the active layer ACT overlapping with the first gate electrode GATE can be a channel region. One of the two first source-drain electrode patterns SD1 can be connected to one side of the channel region in the active layer ACT, and the other of the two first source-drain electrode patterns SD1 can be connected to the other side of the channel region in the active layer ACT.

A passivation layer PAS0 can be disposed to cover the two first source-drain electrode patterns SD1. A planarization layer PLN can be disposed on the passivation layer PAS0. The planarization layer PLN can include a first planarization layer PLN1 and a second planarization layer PLN2.

The first planarization layer PLN1 can be disposed on the passivation layer PAS0.

A second source-drain electrode pattern SD2 can be disposed on the first planarization layer PLN1. The second source-drain electrode pattern SD2 can be connected to one of the two first source-drain electrode patterns SD1 (corresponding to the second node N2 of the driving transistor DRT in the subpixel SP of FIG. 3) through the contact hole of the first planarization layer PLN1.

A second planarization layer PLN2 can be disposed while covering the second source-drain electrode pattern SD2. A light emitting device ED can be disposed on the second planarization layer PLN2.

In a stacked structure of the light emitting device ED, an anode electrode AE can be disposed on the second planarization layer PLN2. The anode electrode AE can be electrically connected to the second source-drain electrode pattern SD2 through a contact hole of the second planarization layer PLN2.

A bank BANK can be disposed to cover a part of the anode electrode AE. A part of the bank BANK corresponding to an emission area EA of the subpixel SP can be opened.

A part of the anode electrode AE can be exposed to an opening (e.g., open portion) of the bank BANK. An emission layer EL can be located on a side of the bank BANK and in the opening (e.g., open portion) of the bank BANK. All or a part of the emission layer EL can be located between adjacent banks BANK.

In the opening of the bank BANK, the emission layer EL can be in contact with the anode electrode AE. A cathode electrode CE can be disposed on the emission layer EL.

A light emitting device ED can be formed by the anode electrode AE, the emission layer EL and the cathode electrode CE. The emission layer EL can include an organic film.

An encapsulation layer ENCAP can be disposed on the light emitting device ED.

Figure 6:
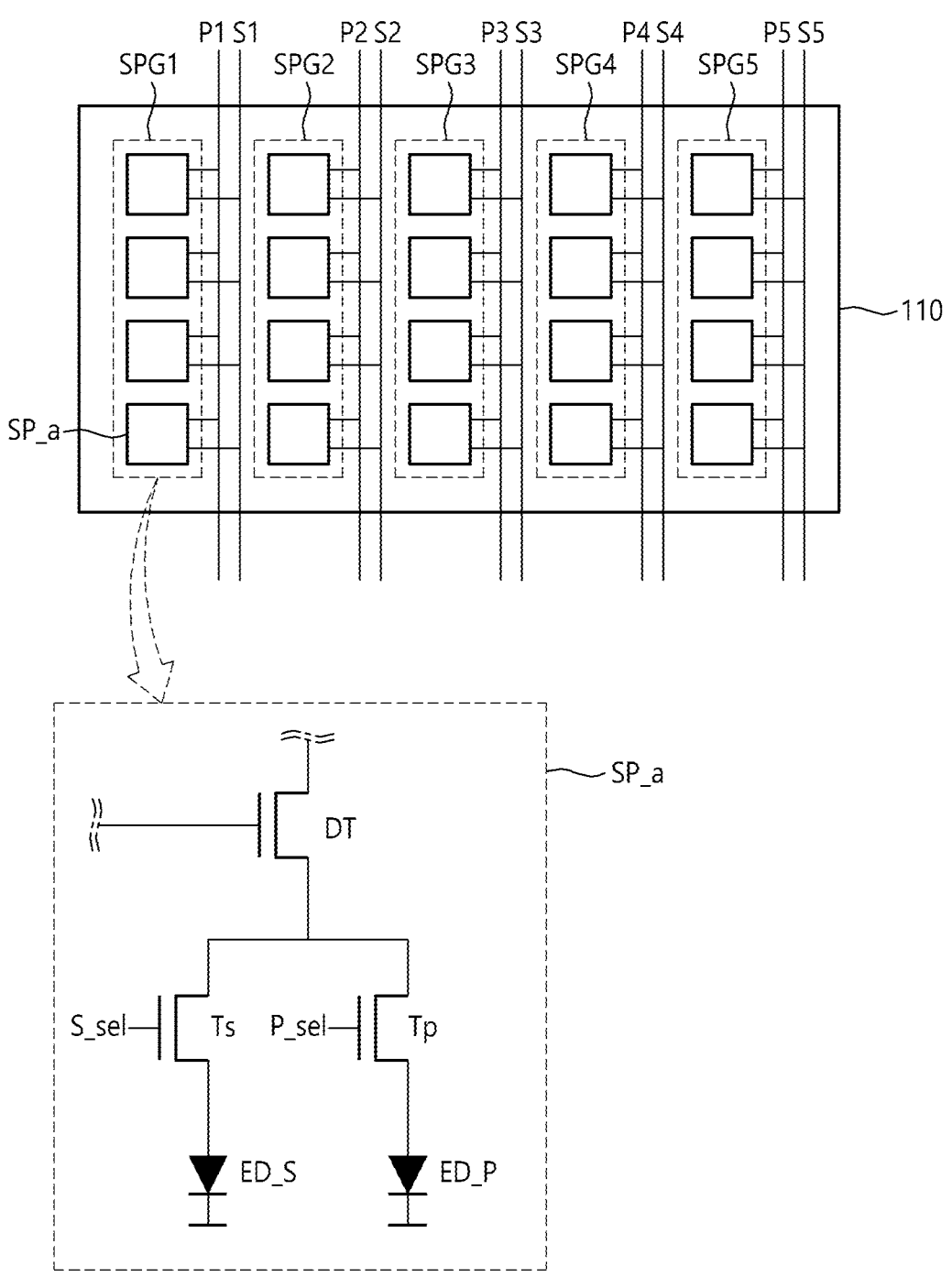
FIGS. 6, 7, and 8 illustrate a display panel having a plurality of subpixels emitting light at a narrow or wide angle according to embodiments of the present disclosure.
Figure 7:
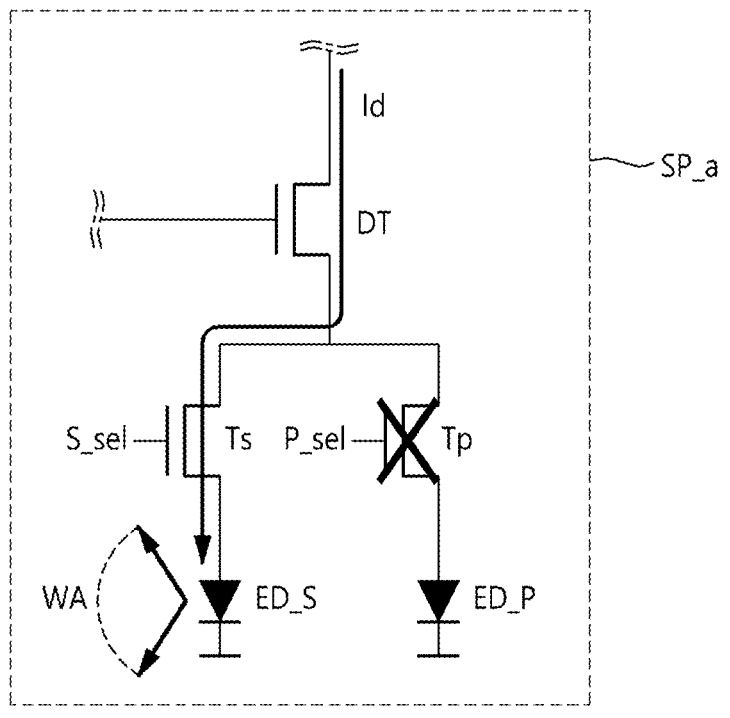

The encapsulation layer ENCAP can have a single-layer structure or a multi-layer structure. For example, as illustrated in FIGS. 6 and 7, the encapsulation layer ENCAP can include a first inorganic encapsulation layer PAS1, an organic encapsulation layer PCL and a second inorganic encapsulation layer PAS2.

For example, the first inorganic encapsulation layer PAS1 and the second inorganic encapsulation layer PAS2 can be inorganic films, and the organic encapsulation layer PCL can be an organic film. Among the first inorganic encapsulation layer PAS1, the organic encapsulation layer PCL, and the second inorganic encapsulation layer PAS2, the organic encapsulation layer PCL can be the thickest, and can act as a planarizing layer.

The first inorganic encapsulation layer PAS1 can be disposed on the cathode electrode CE, and can be disposed closest to the light emitting device ED. The first inorganic encapsulation layer PAS1 can be formed of an inorganic insulating material capable of low-temperature deposition. For example, the first inorganic encapsulation layer PAS1 can include silicon nitride (SiNx), silicon oxide (SiOx), silicon oxynitride (SiON), aluminum oxide (Al$_2$O$_3$), and the like. Since the first inorganic encapsulation layer PAS1 is deposited in a low-temperature atmosphere, the first inorganic encapsulation layer PAS1 can prevent the emission layer EL including an organic material vulnerable to a high-temperature atmosphere from being damaged during the deposition process.

The organic encapsulation layer PCL can be formed with a smaller area than the first inorganic encapsulation layer PAS1. In this case, the organic encapsulation layer PCL can be formed to expose both ends of the first inorganic encapsulation layer PAS1. The organic encapsulation layer PCL can act as a buffer to relieve stress between each layer due to the bending of the display device 100, and can also act to enhance the flattening performance. For example, the organic encapsulation layer PCL can be made of an acrylic resin, an epoxy resin, a polyimide, polyethylene, or a silicon oxycarbon SiOC, and can be formed of an organic insulating material. For example, the organic encapsulation layer PCL can be formed through an inkjet process.

The second inorganic encapsulation layer PAS2 can be formed on the substrate SUB on which the organic encapsulation layer PCL is formed, so as to cover the upper surface and side surface of each of the organic encapsulation layer PCL and the first inorganic encapsulation layer PAS1. The second inorganic encapsulation layer PAS2 can minimize or block external moisture or oxygen from penetrating into the first inorganic encapsulation layer PAS1 and the organic encapsulation layer PCL. For example, the second inorganic encapsulation layer PAS2 can be formed of an inorganic insulating material such as silicon nitride (SiNx), silicon oxide (SiOx), silicon oxynitride (SiON), or aluminum oxide (A (Al$_2$O$_3$).

If the touch sensor TS is of a type built into the display panel 110, the touch sensor TS can be disposed on the encapsulation layer ENCAP. The touch sensor structure will be described in detail as follows.

A touch buffer film T-BUF can be disposed on the encapsulation layer ENCAP. The touch sensor TS can be disposed on the touch buffer film T-BUF.

The touch sensor TS can include a touch sensor metal TSM and a bridge metal BRG located in different layers.

A touch interlayer insulating film T-ILD can be disposed between the touch sensor metal TSM and the bridge metal BRG.

For example, the touch sensor metal TSM can include a first touch sensor metal TSM, a second touch sensor metal TSM, and a third touch sensor metal TSM disposed adjacent to each other. If the third touch sensor metal TSM is located between the first touch sensor metal TSM and the second touch sensor metal TSM, and the first touch sensor metal TSM and the second touch sensor metal TSM are required to be electrically connected to each other, the first touch sensor metal TSM and the second touch sensor metal TSM can be electrically connected to each other through the bridge metal BRG located in a different layer. The bridge metal BRG can be insulated from the third touch sensor metal TSM by the touch interlayer insulating film T-ILD.

When the touch sensor TS is formed on the display panel 110, there can be generated a chemical solution (e.g., developer solution or etchant, etc.) used in the process or moisture from the outside. Since the touch sensor TS is disposed on the touch buffer film T-BUF, there can prevent the chemical solution or moisture from penetrating into the emission layer EL containing an organic material during the manufacturing process of the touch sensor TS. Accordingly, the touch buffer film T-BUF can prevent damage to the emission layer EL vulnerable to the chemical solution or moisture.

The touch buffer film T-BUF can be formed at a low temperature condition below a specific temperature (e.g., 100 degrees (° C.)), and can be formed of an organic insulating material having a low permittivity of 1 to 3 in order to prevent damage to the emission layer EL containing an organic material which is vulnerable to high temperatures. For example, the touch buffer film T-BUF can be formed of an acrylic series, an epoxy series, or a siloxane series material. As the display device 100 bends, the encapsulation layer ENCAP can be damaged and the touch sensor metal positioned on the touch buffer film T-BUF can be broken or disconnected. Even if the display device 100 bends, the touch buffer film T-BUF having flattening performance made of an organic insulating material can prevent damage to the encapsulation layer ENCAP and/or breakage of the metal TSM or BRG forming the touch sensor TS.

A protective layer PAC can be disposed while covering a touch sensor TS. The protective layer PAC can be an organic insulating film.

The display device according to embodiments of the present invention can sense a touch using a mutual-capacitance-based touch sensing method, or can sense a touch using a self-capacitance-based touch sensing method. However, hereinafter, for convenience of explanation, it will be described as an example that the display device performs mutual-capacitance-based touch sensing and has a touch sensor structure therefor.

Figure 5:
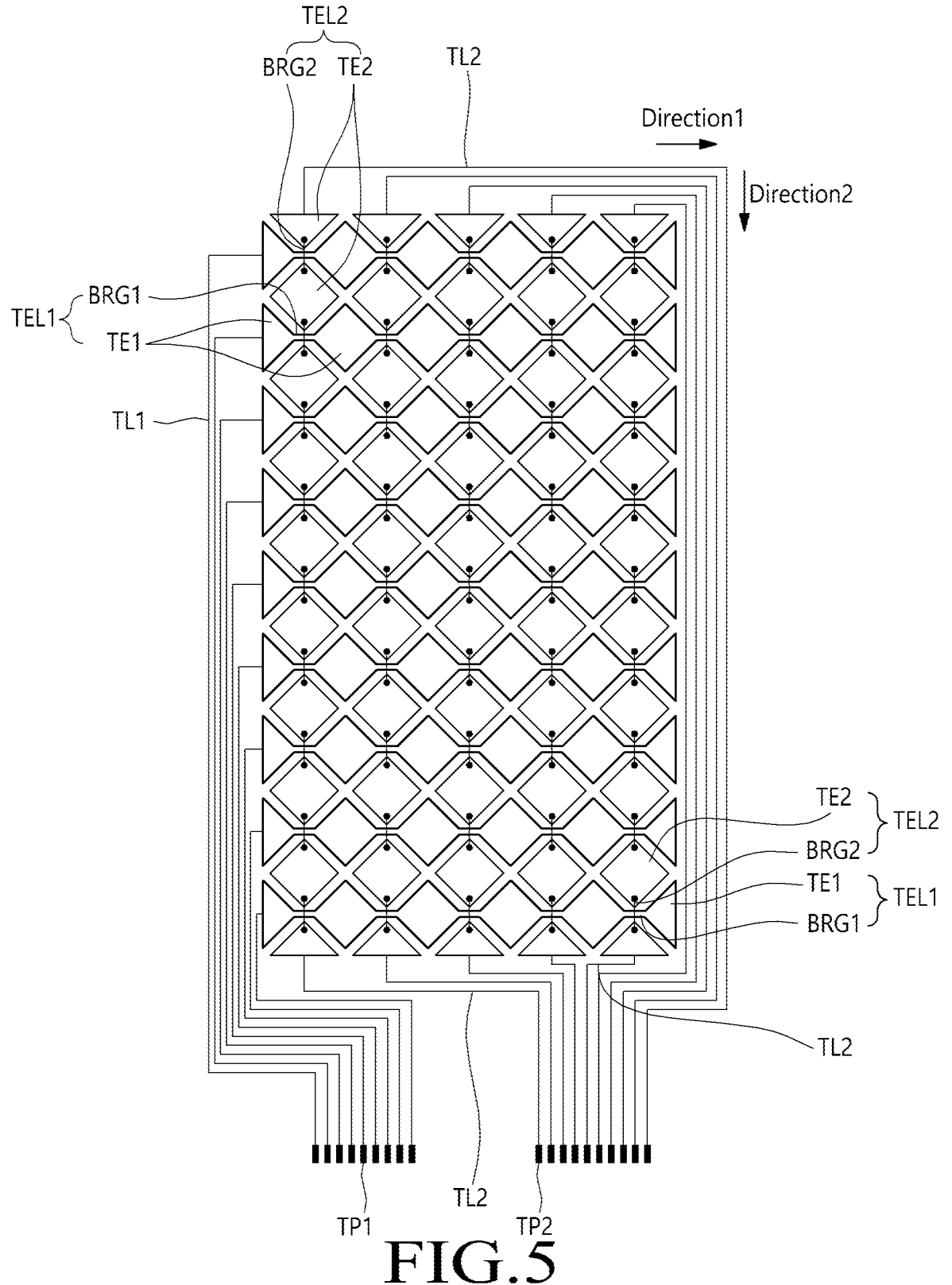
FIG. 5 illustrates configurations for touch sensing according to embodiments of the present disclosure.

FIG. 5 illustrates configurations for touch sensing according to embodiments of the present disclosure.

Referring to FIG. 5, a touch sensor structure for mutual-capacitance-based touch sensing can include a plurality of first touch electrode lines TEL1 and a plurality of second touch electrode lines TEL2. Here, the plurality of first touch electrode lines TEL1 and the plurality of second touch electrode lines TEL2 can be located on an encapsulation layer ENCAP.

Each of the plurality of first touch electrode lines TEL1 can be disposed in a first direction (e.g., direction1), and each of the plurality of second touch electrode lines TEL2 can be disposed in a second direction (e.g., direction2). The first direction and the second direction can intersect each other.

Each of the plurality of first touch electrode lines TEL1 can include a plurality of first touch electrodes TE1 electrically connected to each other. Each of the plurality of second touch electrode lines TEL2 include a plurality of second touch electrodes TE2 which are electrically connected to each other. The plurality of first touch electrodes TE1 and the plurality of second touch electrodes TE2 can be included in the plurality of touch electrodes (TE). The plurality of first touch electrodes TE1 constituting each of the plurality of first touch electrode lines TEL1 can be driving touch electrodes, and the plurality of second touch electrodes TE2 constituting each of the plurality of second touch electrode lines TEL2 can be sensing touch electrodes. In this case, each of the plurality of first touch electrode lines TEL1 can correspond to a driving touch electrode line, and each of the plurality of second touch electrode lines TEL2 can correspond to a sensing touch electrode line.

The touch sensor metal for touch sensing can include a plurality of touch routing lines TL in addition to the plurality of first touch electrode lines TEL1 and the plurality of second touch electrode lines TEL2. The plurality of touch routing lines TL can include one or more first touch routing lines TL1 connected to each of the plurality of first touch electrode lines TEL1, and one or more second touch routing lines TL2 connected to each of the plurality of second touch electrode lines TEL2.

Each of the plurality of first touch electrode lines TEL1 can include a plurality of first touch electrodes TE1 arranged in the same row (or column) and one or more first bridge metals BRG1 electrically connecting the plurality of first touch electrodes TE1. Here, the first bridge metal BRG1 connecting two adjacent first touch electrodes TE1 can be a metal integrated with the two adjacent first touch electrodes TE1, or can be a metal connected to the two adjacent first touch electrodes TE1 through a contact hole.

Each of the plurality of second touch electrode lines TEL2 can include a plurality of second touch electrodes TE2 arranged in the same column (or row) and one or more second bridge metals BRG2 electrically connecting the plurality of second touch electrodes TE2. Here, the second bridge metal BRG2 connecting two adjacent second touch electrodes TE2 can be a metal integrated with the two adjacent second touch electrodes TE2, or can be a metal connected to two adjacent second touch electrodes TE2) through a contact hole.

Here, the first bridge metal BRG1 or the second bridge metal BRG2 connected to the first touch electrode TEL or the second touch electrode TE2 through the contact hole can be referred to as a "connection pattern."

In the area where the first touch electrode line TEL1 and the second touch electrode line TEL2 intersect (i.e., touch electrode line intersection area), the first bridge metal BRG1 and the second bridge metal BRG2 can intersect.

In this way, in the touch electrode line intersection area, since the first bridge metal BRG1 and the second bridge metal BRG2 intersect, the first bridge metal BRG1 and the second bridge metal BRG2 can be disposed in different layers.

Therefore, in order for the plurality of first touch electrode lines TEL1 and the plurality of second touch electrode lines TEL2 to be arranged to intersect, the plurality of first touch electrodes TE1, the plurality of first bridge metals BRG1, the plurality of second touch electrodes TE2, the plurality of second touch electrode lines TEL2, and the plurality of second bridge metals BRG2 can be disposed in two or more layers.

Each of the plurality of first touch electrode lines TEL1 can be electrically connected to the corresponding first touch pad TP1 through one or more first touch routing lines TL1. For example, the first touch electrode TEL disposed at the outermost end among the plurality of first touch electrodes TEL included in one first touch electrode line TEL1 can be electrically connected to the corresponding first touch pad TP1 through the first touch routing line TL1.

Each of the plurality of second touch electrode lines TEL2 can be electrically connected to the corresponding second touch pad TP2 through one or more second touch routing lines TL2. For example, the second touch electrode TE2 disposed at the outermost end among the plurality of second touch electrodes TE2 included in one second touch electrode line TEL2 can be electrically connected to the corresponding second touch pad TP2 through the second touch routing line TL2.

An embodiment of a touch configuration has been described referring to FIG. 5. Meanwhile, the display device 100 according to the embodiments of the present disclosure can be driven at a wide angle or a narrow angle. The wide angle driving can mean that light emitted from the display panel 110 is emitted at a relatively wide viewing angle. The narrow angle driving can mean that light emitted from the display panel 110 is emitted at a relatively narrow viewing angle. It will be described the wide angle driving and the narrow angle driving with reference to FIGS. 6, 7, and 8.

Figure 8:
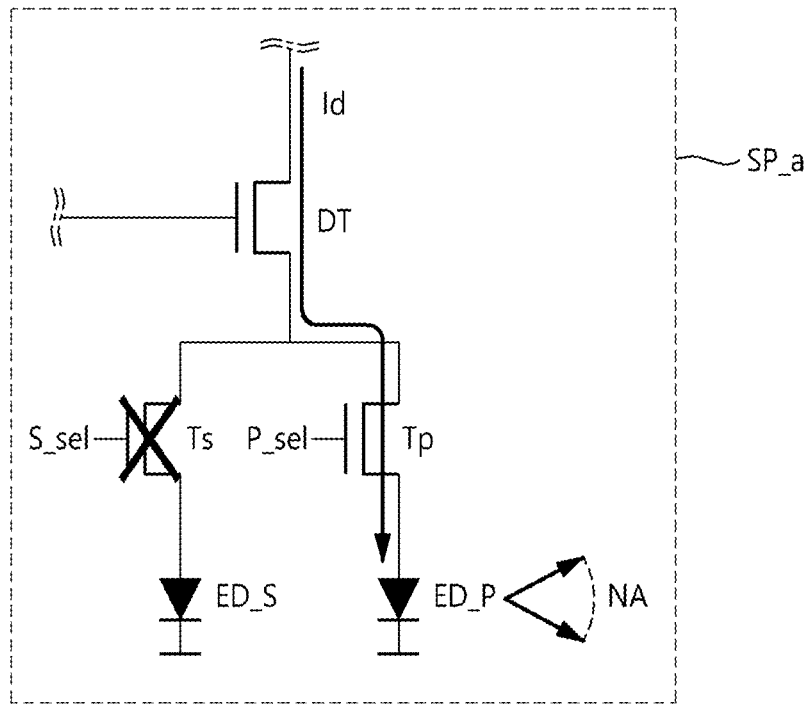

FIGS. 6, 7, and 8 illustrate a display panel 110 having a plurality of subpixels emitting light at a narrow or wide angle according to embodiments of the present disclosure.

In FIG. 6, there is illustrated a display panel 110 in which a plurality of subpixels are disposed.

A plurality of subpixels SP can be disposed in a matrix form.

A plurality of subpixels SP can be grouped in the column direction of the display panel 110. For example, the display panel 110 can include a plurality of subpixel groups SPG.

Referring to FIG. 6, for convenience of explanation, it is assumed that 20 subpixels SP are disposed on the display panel 110. Five subpixel groups SPG can be disposed on the display panel 110. Each subpixel group SPG can include four subpixels.

A first subpixel group SPG1 can be disposed on the leftmost side of the display panel 110, and a fifth subpixel group SPG5 can be disposed on the rightmost side of the display panel 110. A second subpixel group SPG2, a third subpixel group SPG3, and a fourth subpixel group SPG4 can be disposed between the first subpixel group SPG1 and the fifth subpixel group SPG5.

The first subpixel group SPG1 can be electrically connected to a first narrow-angle control line P1 and a first wide-angle control line S1. The first narrow-angle control line P1 and the first wide-angle control line S1 can be electrically connected to the subpixels included in the first subpixel group SPG1.

The second: subpixel group SPG2 can be electrically connected to a second narrow-angle control line P2 and a second wide-angle control line S2. The second narrow-angle control line P2 and the second wide-angle control line S2 can be electrically connected to the subpixels included in the second subpixel group SPG2.

The third subpixel group SPG3 can be electrically connected to a third narrow-angle control line P3 and a third wide-angle control line S3. The third narrow-angle control line P3 and the third wide-angle control line S3 can be electrically connected to subpixels included in the third subpixel group SPG3.

The fourth subpixel group SPG4 can be electrically connected to a fourth narrow-angle control line P4 and a fourth wide-angle control line S4. The fourth narrow-angle control line P4 and the fourth wide-angle control line S4 can be electrically connected to the subpixels included in the fourth subpixel group SPG4.

The fifth subpixel group SPG5 can be electrically connected to a fifth narrow-angle control line P5 and a fifth wide-angle control line S5. The fifth narrow-angle control line P5 and the fifth wide-angle control line S5 can be electrically connected to the subpixels included in the fifth subpixel group SPG5.

The plurality of subpixel groups SPG can emit light at a wide angle or a narrow angle according to the control signals supplied to the narrow-angle control line P and the wide-angle control line S.

The subpixel groups SPG are grouped in the column direction, but the subpixel groups SPG can also be grouped in the row direction depending on the arrangement of the narrow-angle control line P and the wide-angle control line S.

Each of the plurality of subpixels SP) can include a plurality of transistors, capacitors, one or more light emitting devices, etc.

The plurality of subpixels SP can include one driving transistor DT and one or more light emitting devices ED, and the plurality of subpixels SP can be designed in various ways, such as 2T1C, 3T1C, and 6T1C. The plurality of subpixels SP can be any one of a subpixel which does not require characteristic compensation, a subpixel to which an internal compensation method is applied, and a subpixel to which an external compensation method is applied. Since the subpixel SP can be designed in various ways, the characteristics of the driving transistor DT and the light emitting device ED included in the subpixel SP will be described, and the description of other elements included in the subpixel SP can be omitted.

There is illustrated a part of an equivalent circuit of one subpixel SP_a included in the first subpixel group SPG1.

The subpixel SP_a can include a driving transistor DT, a first emission control transistor Ts, a second emission control transistor Tp, a first light emitting device ED_S), a second light emitting device ED_P.

A driving current Id can flow through the driving transistor DT by supplying a voltage a gate node of the driving transistor DT. The driving current Id can be supplied to the first light emitting device ED_S or the second light emitting device ED_P. The first light emitting device ED_S and the second light emitting device ED_P can emit light with a brightness corresponding to the driving current Id.

The first emission control transistor Ts can be electrically connected between the driving transistor DT and the first light emitting device ED_S. A gate node of the first emission control transistor Ts can be supplied with a wide-angle control signal S_sel. According to the wide-angle control signal S_sel, the first emission control transistor Ts can control the electrical connection relationship between the driving transistor DT and the first light emitting device ED_S. The wide-angle control signal S_sel can be a voltage of a predetermined level, and can be expressed as a high-level signal or a low-level signal.

The second emission control transistor Tp can be electrically connected between the driving transistor DT and the second light emitting device ED_P. The gate node of the second emission control transistor Tp can be supplied with a narrow-angle control signal P_sel. According to the narrow-angle control signal P_sel, the second emission control transistor Tp can control the electrical connection relationship between the driving transistor DT and the second light emitting device ED_P. The narrow-angle control signal P_sel can be a voltage of a predetermined level, and can be expressed as a high-level signal or a low-level signal.

Referring to FIG. 7, when the first emission control transistor Ts is turned on and the second emission control transistor Tp is turned off, the first light emitting device ED_S can be supplied with a driving current Id. When the first light device ED_S emits light, the subpixel SP_a can emit light while maintaining a wide angle WA.

Referring to FIG. 8, if the second emission control transistor Tp is turned on and the first emission control transistor Ts is turned off, the second light emitting device ED_P can receive a driving current Id. When the second light emitting device ED_P emits light, the subpixel SP_a can emit light while maintaining a narrow angle NA.

When the subpixel SP_a emits light at a wide angle WA, the viewing angle can be wider than when the subpixel SP_a emits light at a narrow angle NA. In this case, not only a user in front of the display panel 110, but also a user on the side of the display panel 110 can view an image displayed on the display panel 110. When the viewing angle is wide, all users positioned within the wide viewing angle can see the image, so this can be referred to as "share mode", "shared mode" or "shared driving".

If the subpixel SP_a emits light at a narrow angle NA, the viewing angle can be narrower than when the subpixel SP_a emits light at a wide angle WA. In this case, only users in front of or close to the front of the display panel 110 can view the image displayed on the display panel 110. When the viewing angle is narrow, only users positioned within the narrow viewing angle can see the image, so this can be referred to as "privacy mode" or "privacy driving".

Meanwhile, the viewing angle can be adjusted through a light refractive structure such as a lens or a viewing angle adjustment layer. In the following, for convenience of explanation, it is assumed that the viewing angle is controlled through a lens.

Figure 9:
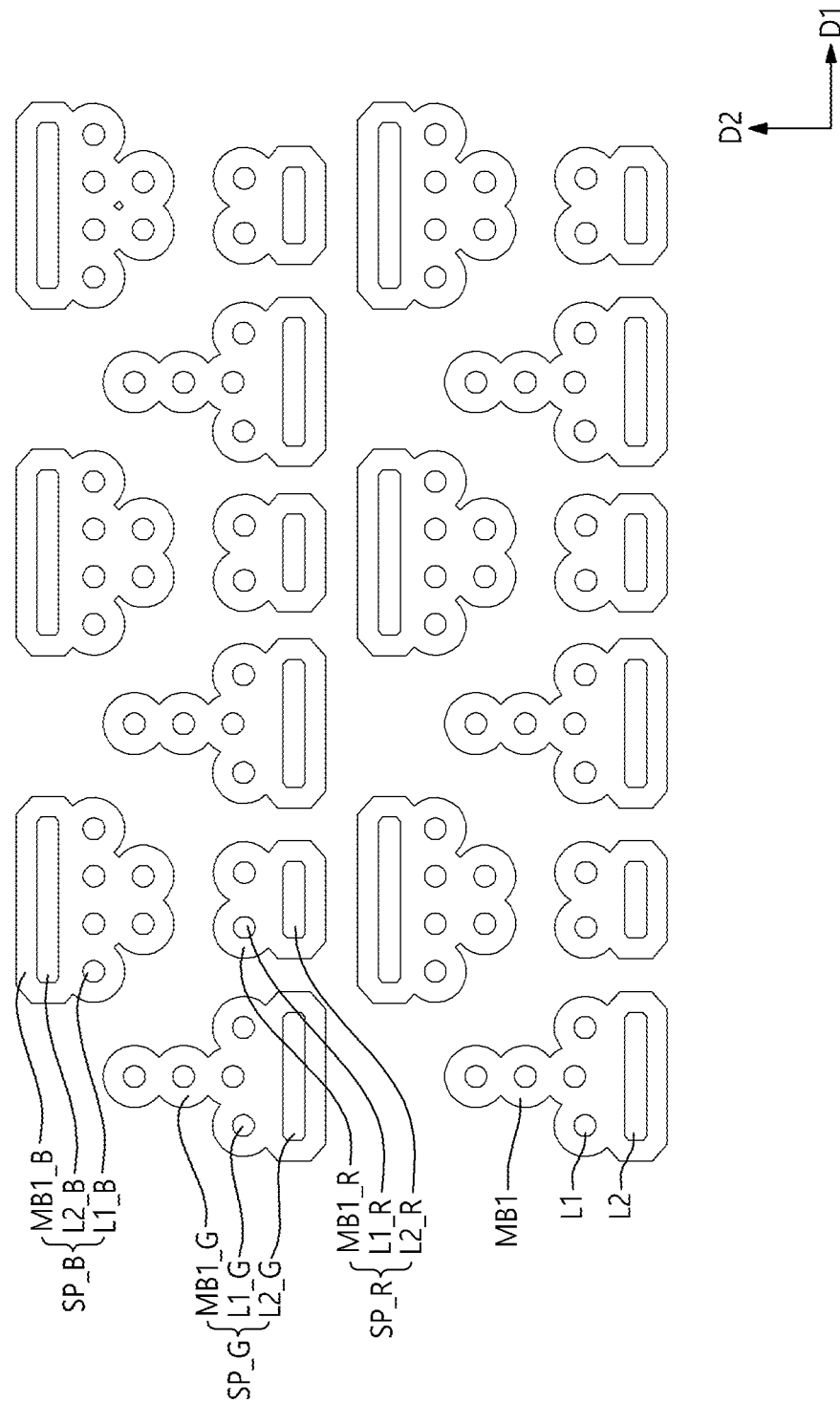
FIGS. 9 and 10 are plan views of a first lens and a second lens disposed to overlap with a subpixel according to embodiments of the present disclosure.
Figure 10:
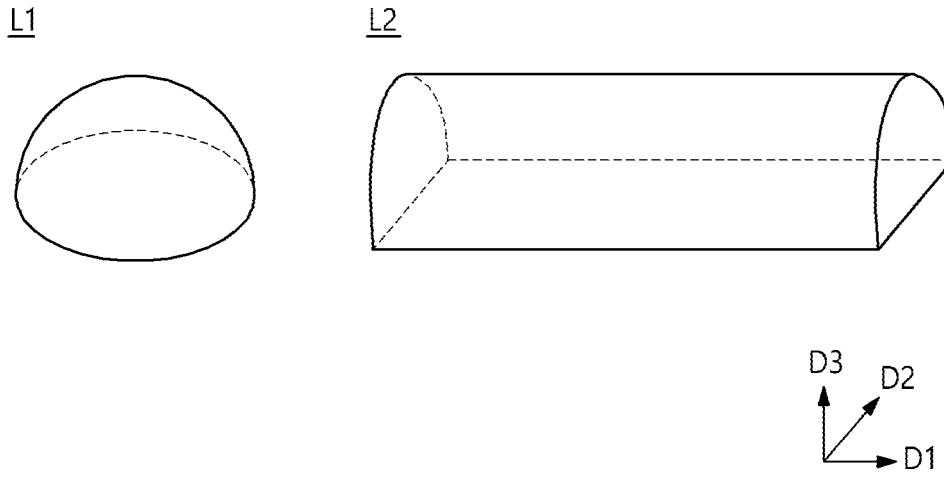

FIGS. 9 and 10 are plan views of a first lens L1 and a second lens L2 disposed to overlap with a subpixel SP_G, SP_G and SP_B according to embodiments of the present disclosure.

Referring to FIG. 9, the plurality of subpixels SP_R, SP_G and SP_B can include a plurality of blue subpixels SP_B, a plurality of green subpixels SP_G, and a plurality of red subpixels SP_R. The plurality of subpixels SP_R, SP_G and SP_B can emit light to the outside.

The plurality of blue subpixels SP_B can emit blue light. The plurality of blue subpixels SP_B can include a first lens L1_B, a second lens L2_B, and a metal barrier MB1_B.

The plurality of green subpixels SP_G can emit green light. The plurality of green subpixels SP_G can include a first lens L1_G, a second lens L2_G, and a metal barrier MB1_G.

A plurality of red subpixels SP_R can emit red light. The plurality of red subpixels SP_R can include a first lens L1_R, a second lens L2_R, and a metal barrier MB1_R.

A plurality of subpixels SP_R, SP_G and SP_B can include a first lens L1 and a second lens L2. Light emitted from the plurality of subpixels SP_G, SP_G can SP_B can pass through the first lens L1 or the second lens L2, and can be emitted to the outside.

Referring to FIG. 10, the first lens L1 can be a hemispherical shape. Referring to FIG. 10, the first lens L1 can be a hemispherical shape which protrudes convexly in a third direction D3. When the first lens L1 illustrated in FIG. 10 is viewed from the third direction D3, the first lens L1 can appear circular as illustrated in FIG. 9. The viewing angle of light emitted through the first lens L1 can be relatively small or narrow.

The second lens L2 can have a semi-cylindrical shape. Referring to FIG. 10, the second lens L2 can have a semi-cylindrical shape that is convexly protruded in the third direction D3. When the second lens L2 illustrated in FIG. 10 is viewed from the third direction D3, the second lens L2 can appear rectangular as illustrated in FIG. 9. The viewing angle of light emitted through the second lens L2 can be relatively large or wide.

A length of the second lens L2 in the first direction D1 can be greater than a length of the first lens L1 in the first direction D1. Therefore, the viewing angle or a field of view of light emitted through the second lens L2 can be relatively greater or wider than the viewing angle or a field of view of light emitted through the first lens L1.

A plurality of blue subpixels SP_B can include a first lens L1_B and a second lens L2_B. In the case that a light emitting device disposed to overlap with the first lens L1_B among the light emitting devices included in the plurality of blue subpixels SP_B emits light, a light emitting device disposed to overlap with the second lens L2_B among the light emitting devices included in the plurality of blue subpixels SP_B may not emit light. When a light emitting device disposed to overlap with the second lens L2_B among the light emitting devices included in the plurality of blue subpixels SP_B emits light, a light emitting device disposed to overlap with the first lens L1_B among the light emitting devices included in the plurality of blue subpixels SP_B may not emit light.

A plurality of green subpixels SP_G can include a first lens L1_G and a second lens L2_G. In the case that a light emitting device disposed to overlap with the first lens L1_G among the light emitting devices included in the plurality of green subpixels SP_G emits light, a light emitting device disposed to overlap with the second lens L2_G among the light emitting devices included in the plurality of green subpixels SP_G may not emit light. When a light emitting device disposed to overlap with the second lens L2_G among the light emitting devices included in the plurality of green subpixels SP_G emits light, a light emitting device disposed to overlap with the first lens L1_G among the light emitting devices included in the plurality of green subpixels SP_B may not emit light.

A plurality of red subpixels SP_R can include a first lens L1_R and a second lens L2_R. In the case that a light emitting device disposed to overlap with the first lens L1_R among the light emitting devices included in the plurality of red subpixels SP_R emits light, a light emitting device disposed to overlap with the second lens L2_R among the light emitting devices included in the plurality of red subpixels SP_R may not emit light. When a light emitting device disposed to overlap with the second lens L2_R among the light emitting devices included in the plurality of red subpixels SP_R emits light, a light emitting device disposed to overlap with the first lens L1_R among the light emitting devices included in the plurality of red subpixels SP_R may not emit light.

A plurality of subpixels SP_R, SP_G and SP_B can include a metal barrier MB1.

In a plan view, the metal barrier MB1 can be disposed on the outside of the first lens L1 and the second lens L2. The metal barrier MB1 can allow light emitted from the subpixels SP_R, SP_G and SP_B to pass through only one lens. For example, the metal barrier MB1 can act as a light blocker or a light shielding member.

The metal barrier MB1 is illustrated as a single layer, but the metal barrier MB1 can be two or more layers. The metal barrier MB1 can include metal, but is not limited thereto.

The number of the first lenses disposed to overlap with the opening area OA of the metal barrier MB1 can be greater than the number of the second lenses disposed to overlap with the opening area OA of the metal barrier MB1.

For example, a plurality of blue subpixels SP_B can include six first lenses L1_B and one second lens L2_B. A plurality of green subpixels SP_G can include four first lenses L1_G and one second lens L2_G. A plurality of red subpixels SP_R can include two first lenses L1_R and one second lens L2_R. However, this is only an example, and the number of first lenses L1 and the number of second lenses L2 can be modified. In addition, the arrangement of the first lens L1 and the arrangement of the second lens L2 can be designed differently from the form illustrated in FIG. 9.

Based on the plan view, a metal barrier MB1_B overlapping with the blue subpixel SP_B can be arranged on the outer portion of six first lenses L1_B and one second lens L2_B.

Based on the plan view, a metal barrier MB1_G overlapping with a green subpixel SP_G can be disposed on the outer portion of four first lenses L1_G and one second lens L2_G.

Based on the plan view, a metal barrier MB1_R overlapping with the red subpixel SP_R can be disposed on the outer part of two first lenses L1_R and one second lens L2_R.

Meanwhile, if the metal barrier MB1 includes metal, the metal barrier MB1 can also be used as a touch electrode. For example, the metal barrier MB1 can act as a light shielding function while also acting as a touch electrode. Hereinafter, it will be described an embodiment in which the metal barrier MB1 is also used as a touch electrode.

Figure 11:
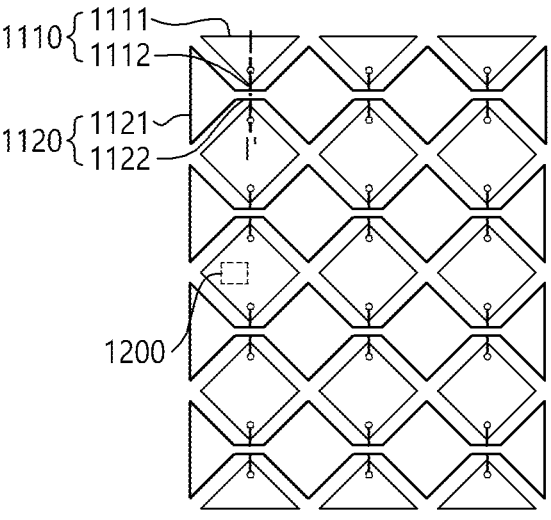
FIG. 11 is a plan view of a touch electrode according to embodiments of the present disclosure.

FIG. 11 is a plan view of a touch electrode according to embodiments of the present disclosure.

Figure 12:
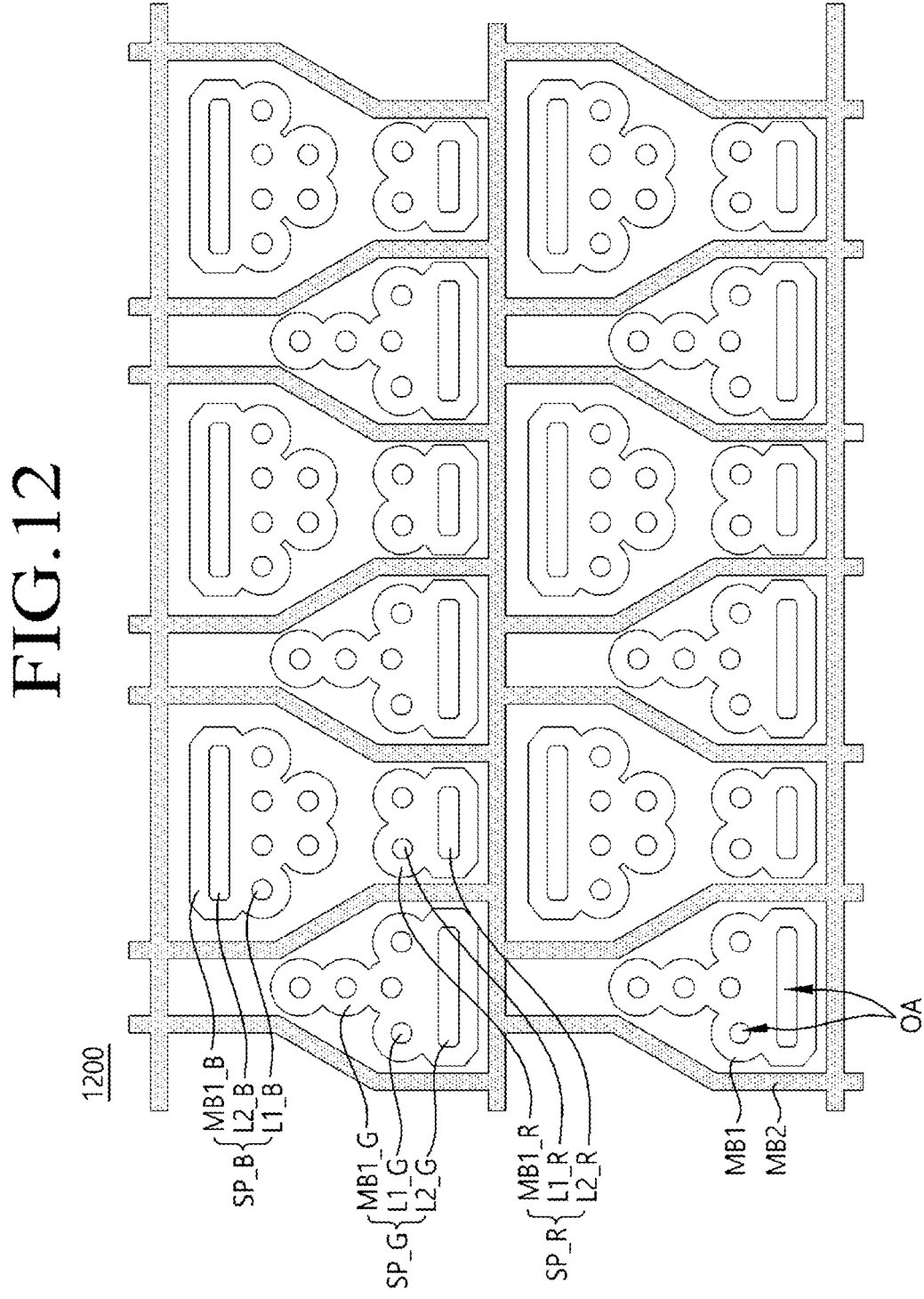
FIG. 12 is an enlarged area of one touch electrode illustrated in FIG. 11.

FIG. 12 is an enlarged area of one touch electrode illustrated in FIG. 11.

Figure 13:
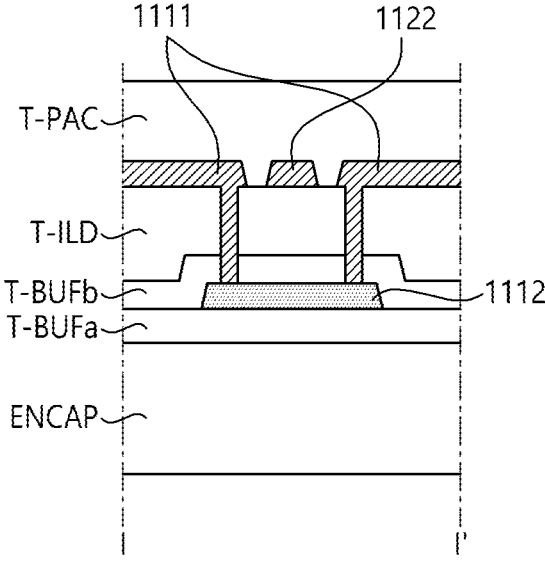
FIG. 13 is a cross-sectional view of an I-I' area of the touch electrode illustrated in FIG. 11.

FIG. 13 is a cross-sectional view of an I-I' area of the touch electrode illustrated in FIG. 11.

In FIG. 11, there are illustrated a plurality of first touch electrode lines 1120 and a plurality of second touch electrode lines 1110. The features of the touch electrode lines 1110 and 1120 in FIG. 11 can be the same as the features of the touch electrode lines TEL1 and TEL2 illustrated in FIG. 5, and the description of the same features can be omitted.

Referring to FIG. 11, each of the first touch electrode lines 1120 can be arranged to extend in a horizontal direction. Each of the first touch electrode lines 1120 can include first touch electrodes 1121 and a second bridge metal 1112.

Each of the second touch electrode lines 1110 can be arranged to extend in a vertical direction. Each of the second touch electrode lines 1110 can include second touch electrodes 1111 and second bridge metals 1112.

An enlarged area of the touch electrode is illustrated in FIG. 12.

Referring to FIG. 12, a plurality of subpixels SP_R, SP_G and SP_B, a first lens L1, a second lens L2, a first metal barrier MB1, and a second metal barrier MB2 can be disposed in the enlarged area of the touch electrode.

The plurality of subpixels SP_R, SP_G and SP_B can include a plurality of blue subpixels SP_B, a plurality of green subpixels SP_G, and a plurality of red subpixels SP_R.

The plurality of blue subpixels SP_B can emit blue light. The plurality of blue subpixels SP_B can include a first lens L1_B, a second lens L2_B, and a first metal barrier MB1_B.

The plurality of green subpixels SP_G can emit green light. The plurality of green subpixels SP_G can include a first lens L1_G, a second lens L2_G, and a first metal barrier MB1_G.

A plurality of red subpixels SP_R can emit red light. The plurality of red subpixels SP_R can include a first lens L1_R, a second lens L2_R, and a first metal barrier MB1_R.

A plurality of subpixels SP_R, SP_G and SP_B can include a first lens L1 and a second lens L2.

The first metal barrier MB1 and a second metal barrier MB2 can include an opening area OA or an aperture area. The first lens L1 and the second lens L2 can be disposed to overlap with the opening area OA.

A plurality of subpixels SP_R, SP_G and SP_B can include a first metal barrier MB1. When viewed from the perspective of the plan view, the first metal barrier MB1 can be disposed on the outer side of the first lens L1 and the second lens L2. Since the first metal barrier MB1 is disposed on the outer side of the first lens L1 and the second lens L2, the outer side of the first metal barrier MB1 can include a curved portion and a straight portion.

The second metal barrier MB2 can be disposed on the outer side of the first metal barrier MB1. The second metal barrier MB2 can allow light emitted from the subpixels SP_R, SP_G and SP_B to pass through only one lens. The second metal barrier MB2 can be disposed on the area between the plurality of subpixels SP_R, SP_G and SP_B. Referring to FIG. 12, the second metal barrier MB2 can include a plurality of metal lines arranged like a spider web. Referring to FIG. 12, the second metal barrier MB2 can be composed of a plurality of metal lines arranged in a horizontal, vertical, and diagonal configuration.

The first metal barrier MB1 and the second metal barrier MB2 can be used as touch electrodes. Referring to FIG. 11, there is illustrated the I-I' area. FIG. 13 illustrates a cross-sectional view of the I-I' area.

Referring to FIG. 13, a first touch buffer film T-BUFa can be disposed on an encapsulation layer ENCAP.

A second bridge metal 1112 can be disposed on the first touch buffer film T-BUFa. In this case, the second bridge metal 1112 illustrated in FIG. 13 can be a part of the first metal barrier MB1 illustrated in FIG. 12.

A second touch buffer film (T-BUFb) can be disposed to cover the first touch buffer film T-BUFa and the second bridge metal 1112.

A touch interlayer insulating film T-ILD can be disposed to cover the second touch buffer film T-BUFb.

A second touch electrode 1111 can be disposed on the touch interlayer insulating film T-ILD. The second touch electrode 1111 can be electrically connected to the second bridge metal 1112 through a contact hole formed in the touch interlayer insulating film T-ILD and the second touch buffer film T-BUFb. Referring to FIG. 13, the second touch electrode 1111 can be disposed in contact with the upper surface of the second bridge metal 1112 through two contact holes. The second touch electrode 1111 illustrated in FIG. 13 can be a part of the second metal barrier MB2 illustrated in FIG. 12.

A bridge metal 1112 can be disposed to overlap with the second bridge metal 1112. The first bridge metal 1122 illustrated in FIG. 13 can be a part of the second metal barrier MB2 illustrated in FIG. 12.

A part of the first metal barrier MB1 illustrated in FIG. 12 can be the first bridge metal 1122 illustrated in FIG. 13. A part of the second metal barrier MB2 illustrated in FIG. 12 can be the second touch electrode 1111 and the second bridge metal 1112 illustrated in FIG. 13. Therefore, the second metal barrier MB2 can be disposed at a higher position than the first metal barrier MB1.

The first metal barrier MB1 and the second metal barrier MB2 can serve as a light shielding function or light blocker while also serving as a touch electrode. Hereinafter, it will be described another embodiment of the metal barrier MB1 serving as both a light shielding function and a touch electrode.

Figure 14:
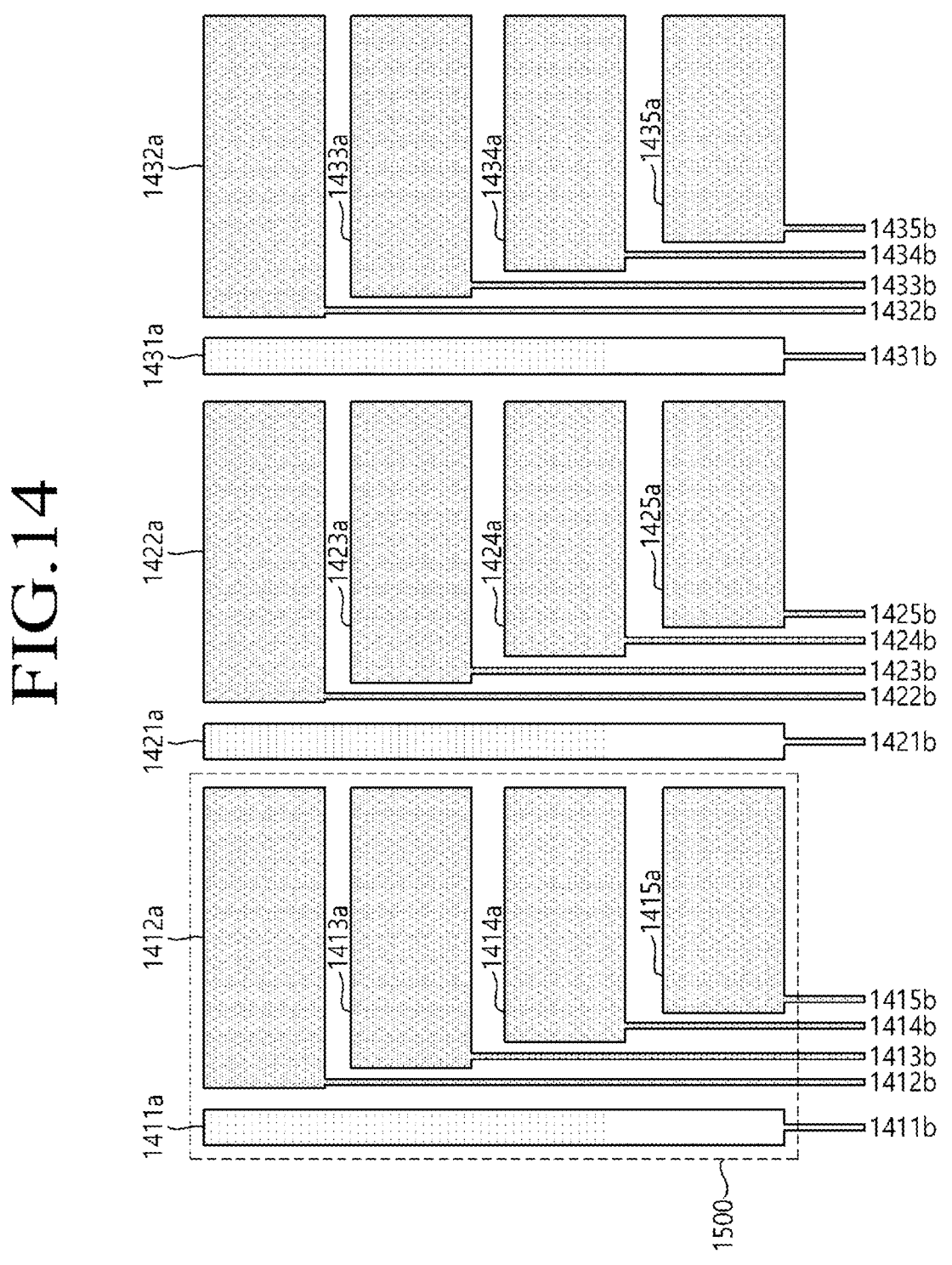
Figure 15:
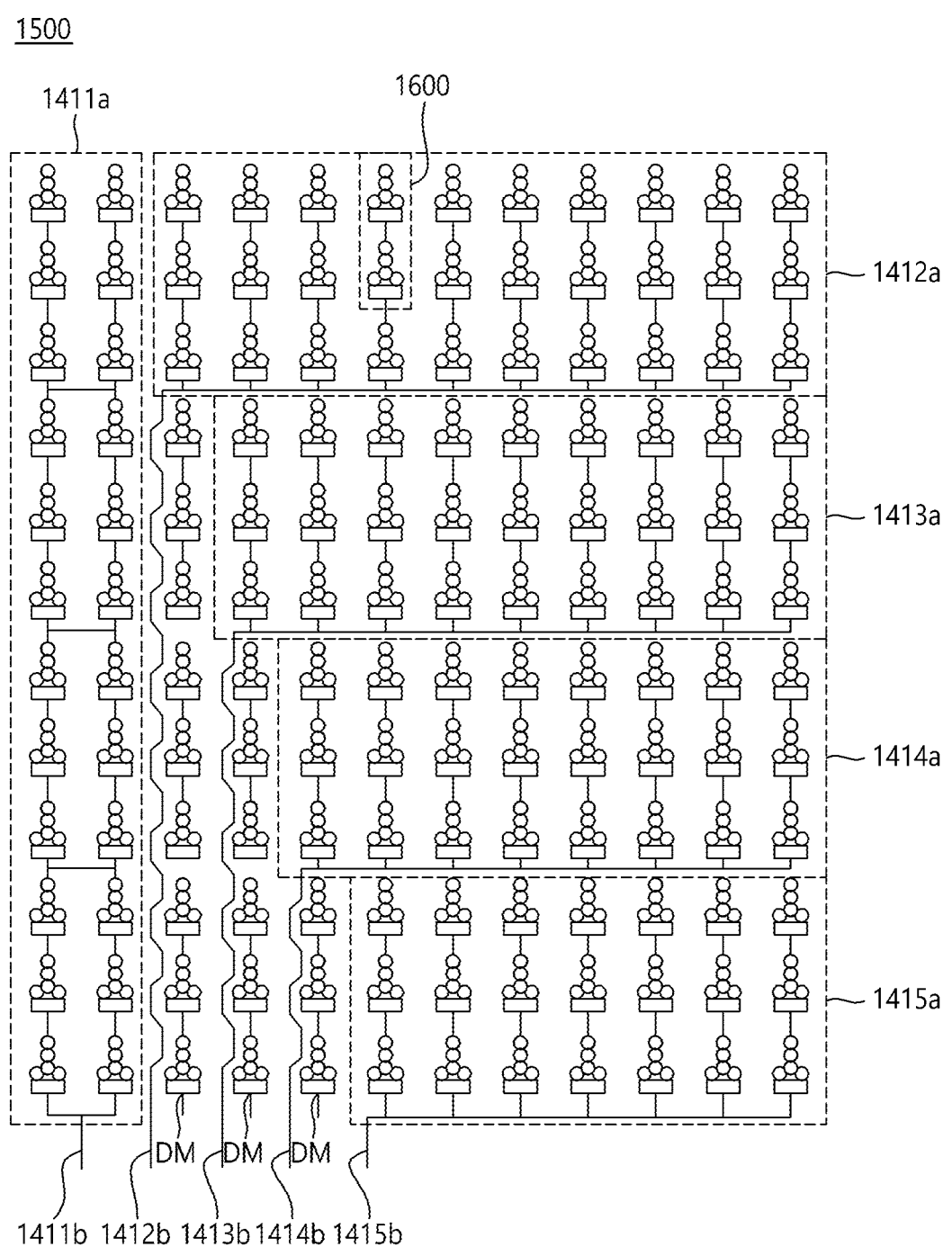

FIGS. 14 and 15 illustrate a touch electrode according to embodiments of the present disclosure.

Figure 16:
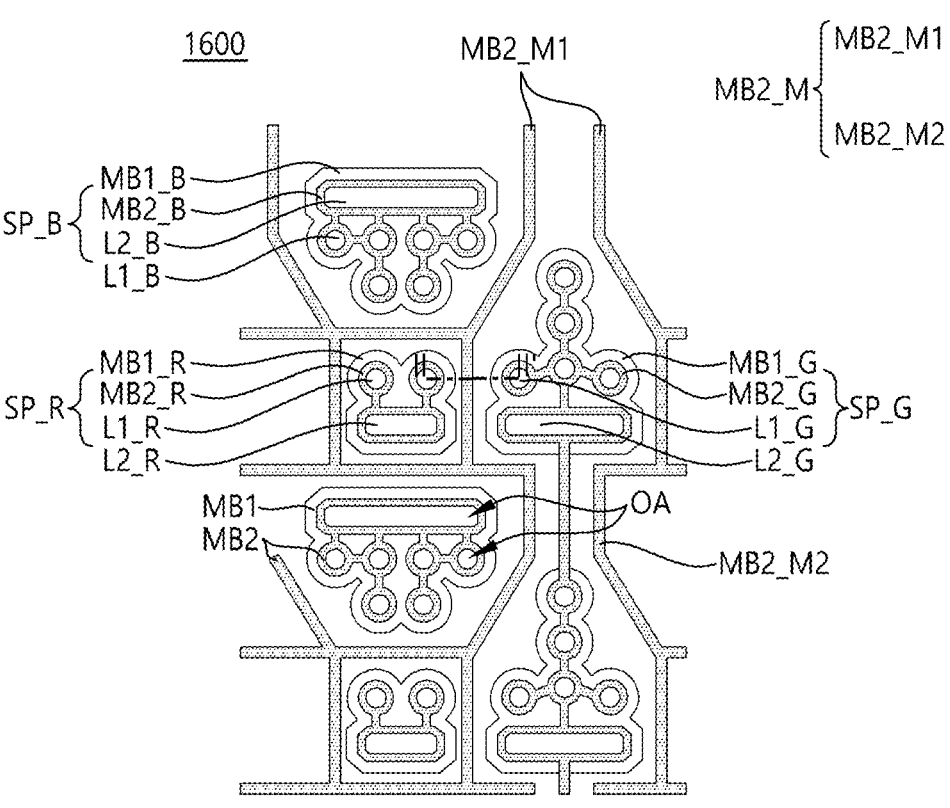
FIG. 16 is an enlarged area of one touch electrode illustrated in FIG. 15.

FIG. 16 is an enlarged area of one touch electrode illustrated in FIG. 15.

Figure 17:
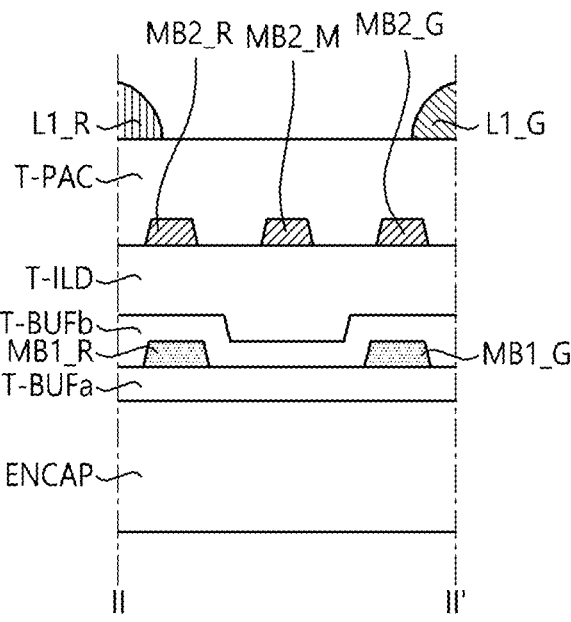
FIG. 17 is a cross-sectional view of an II-II' area of the touch electrode illustrated in FIG. 16.

FIG. 17 is a cross-sectional view of an II-II' area of the touch electrode illustrated in FIG. 16.

Referring to FIG. 14, the first touch electrodes 1411*a*, 1421*a* and 1431*a* can be disposed to extend in a vertical direction. The first touch electrodes 1411*a*, 1421*a* and 1431*a* can be electrically connected to the first touch routing lines 1411*b*, 1421*b* and 1431*b*.

The second touch electrodes 1412*a*, 1422*a* and 1432*a* can have a rectangular shape extending in a horizontal direction. The second touch electrodes 1412*a*, 1422*a* and 1432*a* can be electrically connected to the second touch routing lines 1412*b*, 1422*b* and 1432*b*. The second touch routing lines 1412*b*, 1422*b* and 1432*b* can be disposed between the first touch routing line 1411*b*, 1421*b* and 1431*b*, and the third touch routing line 1413*b*, 1423*b* and 1433*b*. The second touch routing line 1412*b*, 1422*b* and 1432*b* can be disposed on the right side of the first touch routing line 1411*b*, 1421*b* and 1431*b*. The second touch routing line 1412*b*, 1422*b* and 1432*b* can be electrically connected to the second touch electrode 1412*a*, 1422*a* and 1432*a* at the lower left portion of the second touch electrode 1412*a*, 1422*a* and 1432*a*.

The third touch electrodes 1413*a*, 1423*a* and 1433*a* can have a rectangular shape extending in a horizontal direction. The horizontal length of the third touch electrodes 1413*a*, 1423*a* and 1433*a* can be smaller than the horizontal length of the second touch electrodes 1412*a*, 1422*a* and 1432*a*. The third touch electrodes 1413*a*, 1423*a* and 1433*a* can be electrically connected to the third touch routing line 1413*b*, 1423*b* and 1433*b*. The third touch routing line 1413*b*, 1423*b* and 1433*b* can be disposed between the second touch routing line 1412*b*, 1422*b* and 1432*b*, and the fourth touch routing line 1414*b*, 1424*b* and 1434*b*. The length of the third touch routing line 1413*b*, 1423*b* and 1433*b* can be smaller than the length of the second touch routing line 1412*b*, 1422*b* and 1432*b*. The third touch routing line 1413*b*, 1423*b* and 1433*b* can be electrically connected to the third touch electrode 1413*a*, 1423*a* and 1433*a* at the lower left portion of the third touch electrode 1413*a*, 1423*a* and 1433*a*.

The fourth touch electrodes 1414*a*, 1424*a* and 1434*a* can have a rectangular shape extending in the horizontal direction. The horizontal length of the fourth touch electrodes 1414*a*, 1424*a* and 1434*a* can be smaller than the horizontal length of the third touch electrodes 1413*a*, 1423*a* and 1433*a*. The fourth touch electrodes 1414*a*, 1424*a* and 1434*a* can be electrically connected to the fourth touch routing line 1414*b*, 1424*b* and 1434*b*. The fourth touch routing line 1414*b*, 1424*b* and 1434*b* can be disposed between the third touch routing line 1413*b*, 1423*b* and 1433*b* and the fifth touch routing line 1415*b*, 1425*b* and 1435*b*. The length of the fourth touch routing line 1414*b*, 1424*b* and 1434*b* can be smaller than the length of the third touch routing line 1413*b*, 1423*b* and 1433*b*. The fourth touch routing line 1414*b*, 1424*b* and 1434*b* can be electrically connected to the fourth touch electrode 1414*a*, 1424*a* and 1434*a* at the lower left portion of the fourth touch electrode 1414*a*, 1424*a* and 1434*a*.

Referring to FIG. 15, the fifth touch electrodes 1415*a*, 1425*a* and 1435*a* can have a rectangular shape extending in the horizontal direction. The horizontal length of the fifth touch electrodes 1415*a*, 1425*a* and 1435*a* can be smaller than the horizontal length of the fourth touch electrodes 1414*a*, 1424*a* and 1434*a*. The fifth touch electrodes 1415*a*, 1425*a* and 1435*a* can be electrically connected to the fifth touch routing lines 1415*b*, 1425*b* and 1435*b*. The fifth touch routing lines 1415*b*, 1425*b* and 1435*b* can be disposed adjacent to the fourth touch routing lines 1414*b*, 1424*b* and 1434*b*. The length of the fifth touch routing line 1415*b*, 1425*b* and 1435*b* can be smaller than the length of the fourth touch routing line 1414*b*, 1424*b* and 1434*b*. The fifth touch routing line 1415*b*, 1425*b* and 1435*b* can be electrically connected to the fifth touch electrode 1415*a*, 1425*a* and 1435*a* at the lower left portion of the fifth touch electrode 1415*a*, 1425*a* and 1435*a*.

The first touch electrodes 1411*a*, 1421*a*, 1431*a* and the first touch routing line 1411*b*, 1421*b* and 1431*b* can be driving touch electrodes. In this case, the second touch electrodes 1412*a*, 1422*a* and 1432*a*, the third touch electrodes 1413*a*, 1423*a* and 1433*a*, the fourth touch electrodes 1414*a*, 1424*a* and 1434*a*, the fifth touch electrodes 1415*a*, 1425*a* and 1435*a*, the second touch routing lines 1412*b*, 1422*b* and 1432*b*, the third touch routing lines 1413*b*, 1423*b* and 1433*b*, the fourth touch routing lines 1414*b*, 1424*b* and 1434*b*, and the fifth touch routing lines 1415*b*, 1425*b* and 1435*b* can be sensing touch electrodes. In this case, the display device can sense or detect touch through a mutual-capacitance-based touch sensing method.

However, by using the second touch electrodes 1412*a*, 1422*a* and 1432*a*, the third touch electrodes 1413*a*, 1423*a* and 1433*a*, the fourth touch electrodes 1414*a*, 1424*a* and 1434*a*, the fifth touch electrodes 1415*a*, 1425*a* and 1435*a* and the second touch routing line 1412*b*, 1422*b* and 1432*b*, the third touch routing line 1413*b*, 1423*b* and 1433*b*, the fourth touch routing line 1414*b*, 1424*b* and 1434*b*, and the fifth touch routing line 1415*b*, 1425*b* and 1435*b*, the display device can sense a touch through a self-capacitance-based touch sensing method.

The above-described touch sensing method is only an example, and the display device can sense touch by using the touch electrodes and touch routing lines illustrated in FIG. 14.

There are illustrated the touch routing lines 1411*b*, 1412*b*, 1413*b*, 1414*b* and 1415*b*, and the touch electrodes 1411*a*, 1412*a*, 1413*a*, 1414*a* and 1415*a* configured using the metal barrier MB1 illustrated in FIG. 16.

The touch electrodes 1411*a*, 1412*a*, 1413*a*, 1414*a* and 1415*a* can be configured with a plurality of metal barriers MB1.

The first touch electrode 1411*a* can include 24 metal barriers MB1. The 24 metal barriers MB1 can be arranged in 12 rows in the horizontal direction and 2 rows in the vertical direction. The 24 metal barriers MB1 can be electrically connected to each other. The metal barriers MB1 adjacent to each other vertically can be electrically connected to each other. Some of the metal barriers MB1 adjacent to each other left and right can be electrically connected to each other.

The second touch electrode 1412*a* can be composed of 30 metal barriers MB1. The 30 metal barriers MB1 can be arranged in 3 rows in the horizontal direction and 10 rows in the vertical direction. The 30 metal barriers MB1 can be electrically connected to each other. The metal barriers MB1 adjacent to each other vertically can be electrically connected to each other. Some of the metal barriers MB1 adjacent to each other left and right can be electrically connected to each other.

The third touch electrode 1413*a* can be composed of 27 metal barriers MB1. The 27 metal barriers MB1 can be arranged in 3 rows in the horizontal direction and 9 rows in the vertical direction. The 27 metal barriers MB1 can be electrically connected to each other. The metal barriers MB1 adjacent to each other vertically can be electrically connected to each other. Some of the metal barriers MB1 adjacent to each other left and right can be electrically connected to each other.

The fourth touch electrode 1414*a* can be composed of 24 metal barriers MB1. The 24 metal barriers MB1 can be arranged in 3 rows in the horizontal direction and 8 rows in the vertical direction. The 24 metal barriers MB1 can be electrically connected to each other. The metal barriers MB1 adjacent to each other vertically can be electrically connected to each other. Some of the metal barriers MB1 adjacent to each other left and right can be electrically connected to each other.

The fifth touch electrode 1415*a* can be composed of 21 metal barriers MB1. The 21 metal barriers MB1 can be arranged in 3 rows in the horizontal direction and 7 rows in the vertical direction. The 21 metal barriers MB1 can be electrically connected to each other. The metal barriers MB1 adjacent to each other vertically can be electrically connected to each other. Some of the metal barriers MB1 adjacent to each other left and right can be electrically connected to each other.

The number of metal barriers MB1 included in the touch electrodes 1411*a*, 1412*a*, 1413*a*, 1414*a* and 1415*a* can be varied depending on the design. For example, the first touch electrode 1411*a* can be composed of only one vertically arranged metal barrier MB1. For example, each of the second touch electrode 1412*a*, the third touch electrode 1413a, the fourth touch electrode 1414a and the fifth touch electrode 1415a can be composed of only one horizontally arranged metal barrier MB1.

A dummy metal barrier DM can be disposed between the first touch electrode 1411a and the second touch electrode 1412a. The dummy metal barriers MB can be disposed between the first touch electrode 1411a and the third touch electrode 1413a. The dummy metal barriers MB can be disposed between the first touch electrode 1411a and the fourth touch electrode 1414a. The dummy metal barriers MB can be disposed between the first touch electrode 1411a and the fifth touch electrode 1415a. Referring to FIG. 15, the dummy metal barrier DM can be electrically connected to the touch electrodes 1411a, 1412a, 1413a, 1414a and 1415a. The dummy metal barriers DM can be electrically connected to each other. However, each of the dummy metal barriers DM may not be electrically connected to each other. The dummy metal barrier DM can play the same role as the dummy metal illustrated in FIG. 3.

The first touch electrode 1411a can be electrically connected to the first touch routing line 1411b. The second touch electrode 1412a can be electrically connected to the second touch routing line 1412b. The third touch electrode 1413a can be electrically connected to the third touch routing line 1413b. The fourth touch electrode 1414a can be electrically connected to the fourth touch routing line 1414b. The fifth touch electrode 1415a can be electrically connected to the fifth touch routing line 1415b. The touch routing line 1411b can be configured with a metal barrier MB1.

There is illustrated only the metal barrier MB1 included in the green subpixel SP_G among the metal barriers MB1. The metal barrier MB1 included in the green subpixel SP_G can be configured as touch electrodes since they are electrically connected to each other.

However, the touch electrodes can be configured using the metal barriers MB1 included in the red subpixel SP_R rather than the metal barriers MB1 included in the green subpixel SP_G. In addition, the touch electrodes can be configured using the metal barriers MB1 included in the blue subpixel SP_B. However, for the convenience of explanation, it is assumed that the touch electrodes are configured using the metal barriers MB1 included in the green subpixel SP_G.

There is illustrated an area 1600 indicating two metal barriers MB1 included in the second touch electrode 1412a. FIG. 16 is an enlarged plan view of an area 1600 indicating two metal barriers MB1 included in a second touch electrode 1412a.

Referring to FIG. 16, a plurality of blue subpixels SP_B can emit blue light. The plurality of blue subpixels SP_B can include a first lens L1_B, a second lens L2_B, a first metal barrier MB1_B, and a second metal barrier MB2_B.

A plurality of green subpixels SP_G can emit green light. The plurality of green subpixels SP_G can include a first lens L1_G, a second lens L2_G, a first metal barrier MB1_G, and a second metal barrier MB2_G.

A plurality of red subpixels SP_R can emit red light. The plurality of red subpixels SP_R can include a first lens L1_R, a second lens L2_R, a first metal barrier MB1_R, and a second metal barrier MB2_R.

The first metal barrier MB1 can include an opening area OA from which a portion of the first metal barrier MB1 is removed.

A portion of the second metal barrier MB2 can include an opening area OA from which a portion of the second metal barrier MB2 is removed.

Another portion MB2_M1 of the second metal barrier MB2 can be not disposed to overlap with the subpixels SP_R, SP_G and SP_B, and can be disposed in an area between the plurality of subpixels SP_R, SP_G and SP_B. Referring to FIG. 16, another part MB2_M1 of the second metal barrier MB2 can be formed of a plurality of metal lines arranged like a spider web.

The second metal barrier MB2 disposed in the area between the plurality of subpixels SP_R, SP_G and SP_B can be arranged in the same layer as the second metal barrier MB2 including the opening area OA).

The outer area of the first metal barrier MB1 can be wider than the outer area of the second metal barrier MB2. Based on the plan view, the second metal barrier MB2 can be arranged to overlap with the first metal barrier MB1 on the upper surface of the first metal barrier MB1.

The first lens L1 and the second lens L2 can be disposed to overlap with the opening area OA included in the first metal barrier MB1 and the second metal barrier MB2.

Based on the plan view, the first metal barrier MB1 and the second metal barrier MB2 overlapping with the blue subpixel SP_B can be disposed on the outer portions of the six first lenses L1 and one second lens L2.

Based on the plan view, the first metal barrier MB1_G and the second metal barrier MB2 included in the green subpixel SP_G can be disposed on the outer portions of five first lenses L1 and one second lens L2.

The first metal barrier MB1_R and the second metal barrier MB2 included in the red subpixel SP_R can be disposed on the outer portions of two first lenses L1 and one second lens L2.

The second metal barrier MB2 can include a portion MB2_G including an opening area OA and a portion MB2_M2 not including an opening area OA.

Based on the plan view, the second metal barrier MG2_G included in the green subpixel SP_G can be disposed to be extended to the metal barrier MB2_G included in the green subpixel SP_G positioned below the green subpixel SP_G.

The second metal barrier MG2_G can include an extended portion MB2_M2 extended to a lower portion in the green subpixel SP_G, and a portion MB2_M1 disposed to be spaced apart from the extended portion MB2_M2. Referring to FIG. 16, the extended portion MB2_M2 can be disposed to be spaced apart from the second metal barrier MG2_M arranged on the left and right sides of the extended portion MB2_M2.

There can be illustrated the II-II' area. FIG. 17 is a cross-sectional view of the II-II' area of FIG. 16.

Referring to FIG. 17, a first touch buffer film T-BUFa can be disposed on an encapsulation layer ENCAP.

The first metal barrier MB1_R included in the red subpixel SP_R and the first metal barrier MB1_G included in the green subpixel SP_G can be disposed on the first touch buffer film T-BUFa.

A second touch buffer film T-BUFb can be disposed to cover the first touch buffer film T-BUFa and the first metal barriers MB1.

A touch interlayer insulating film T-ILD can be disposed to cover the second touch buffer film T-BUFb.

The second metal barriers MB2 can be disposed on the touch interlayer insulating film T-ILD.

The second metal barrier MB2_R included in the red subpixel SP_R can be disposed on the touch interlayer insulating film T-ILD.

The second metal barrier MB2_G included in the green subpixel SP_G can be disposed on the touch interlayer insulating film T-ILD.

The second metal barrier MB2_M not included in the subpixels SP_R, SP_G and SP_B can be disposed on the touch interlayer insulating film T-ILD.

Based on the cross-sectional view, each of the second metal barriers MB2_R, MB2_M and MB2_G can be disposed to be spaced apart from each other.

A protective film T-PAC can be disposed to cover the second metal barriers MB2_R, MB2_M and MB2_G.

The first lenses L1_R and L1_G can be disposed on the protective film T-PAC. Light incident on the first lens L1_R and L1_G can pass through the first lens L1_R and L1_G, and then be emitted at a predetermined angle. When the light passes through the first lenses L1_R and L1_G, the viewing angle of the light passing through the first lenses L1_R, L1_G can be relatively small or narrow.

The first lens L1_R included in the red subpixel SP_R can be disposed on the protective film T-PAC. When viewed based on the cross-sectional view, a part of the first lens L1_R included in the red subpixel SP_R can be disposed to overlap with a part of the first metal barrier MB1_R and a part of the second metal barrier MB2_R. However, a part of the first lens L1_R can be disposed so as not to overlap with a part of the first metal barrier MB1_R and a part of the second metal barrier MB2_R.

The first lens L1_G included in the green subpixel SP_G can be disposed on the protective film T-PAC. When viewed from the cross-sectional view, a part of the first lens L1_G included in the green subpixel SP_G can be disposed so as to overlap with a part of the first metal barrier MB1_G and a part of the second metal barrier MB2_G. However, a part of the first lens L1_G can be disposed so as not to overlap with a part of the first metal barrier MB1_G and a part of the second metal barrier MB2_G.

Referring to FIG. 16 and FIG. 17, the first metal barrier MB1 and the second metal barrier MB2 can provide a light shielding function. Referring to FIG. 15, the second metal barrier MB2 can serve as a touch electrode. For example, the second metal barrier MB2 can act as a light shielding member while also acting as a touch electrode. In addition, since the touch electrode is formed using only the second metal barrier MB2, there can be thinner a layer on which the touch electrode is disposed.

Hereinafter, it will be described another embodiment of the metal barrier MB1 that simultaneously acts as a light shielding member and a touch electrode.

Figure 18:
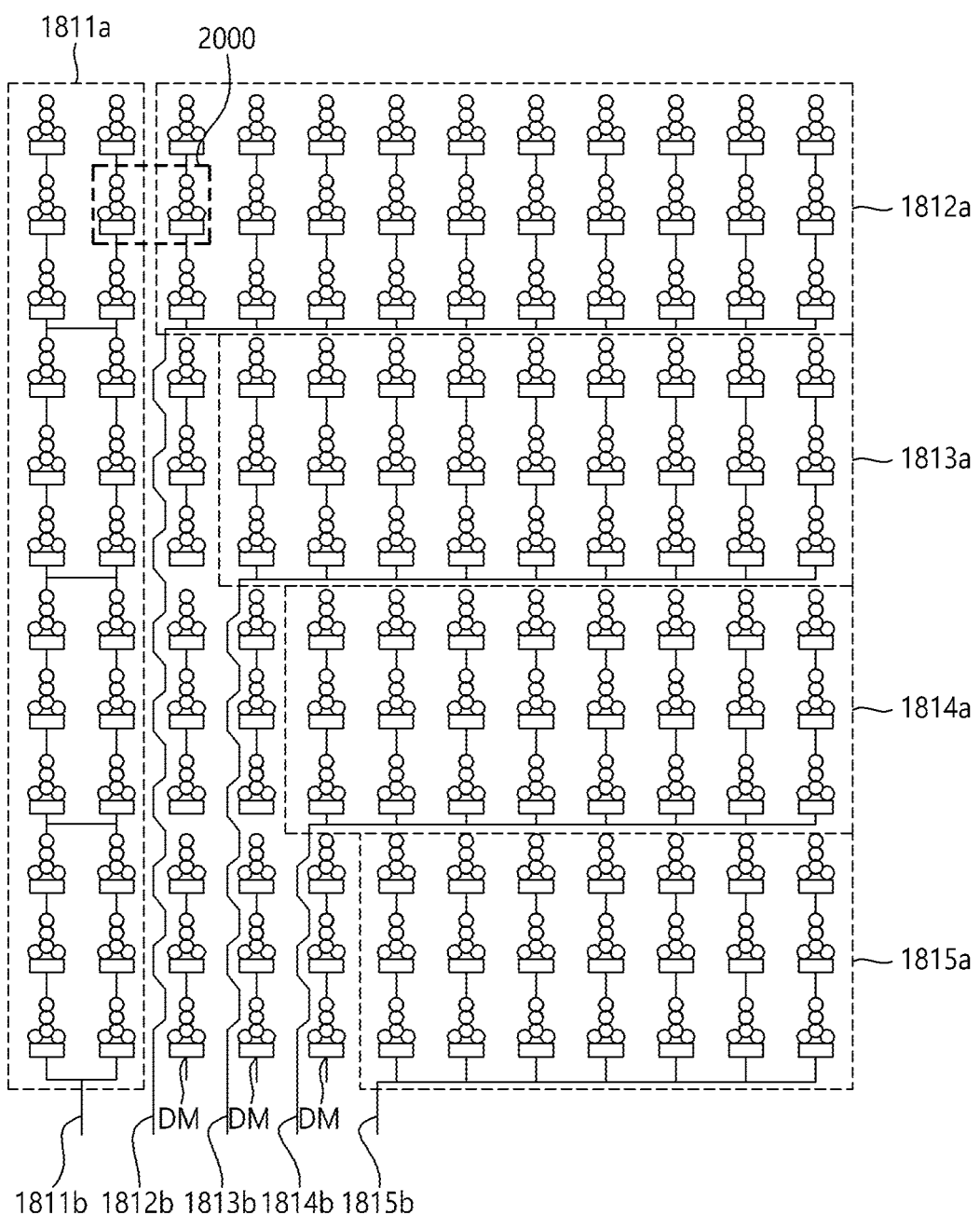
FIGS. 18 and 19 illustrate a touch electrode according to embodiments of the present disclosure.
Figure 19:
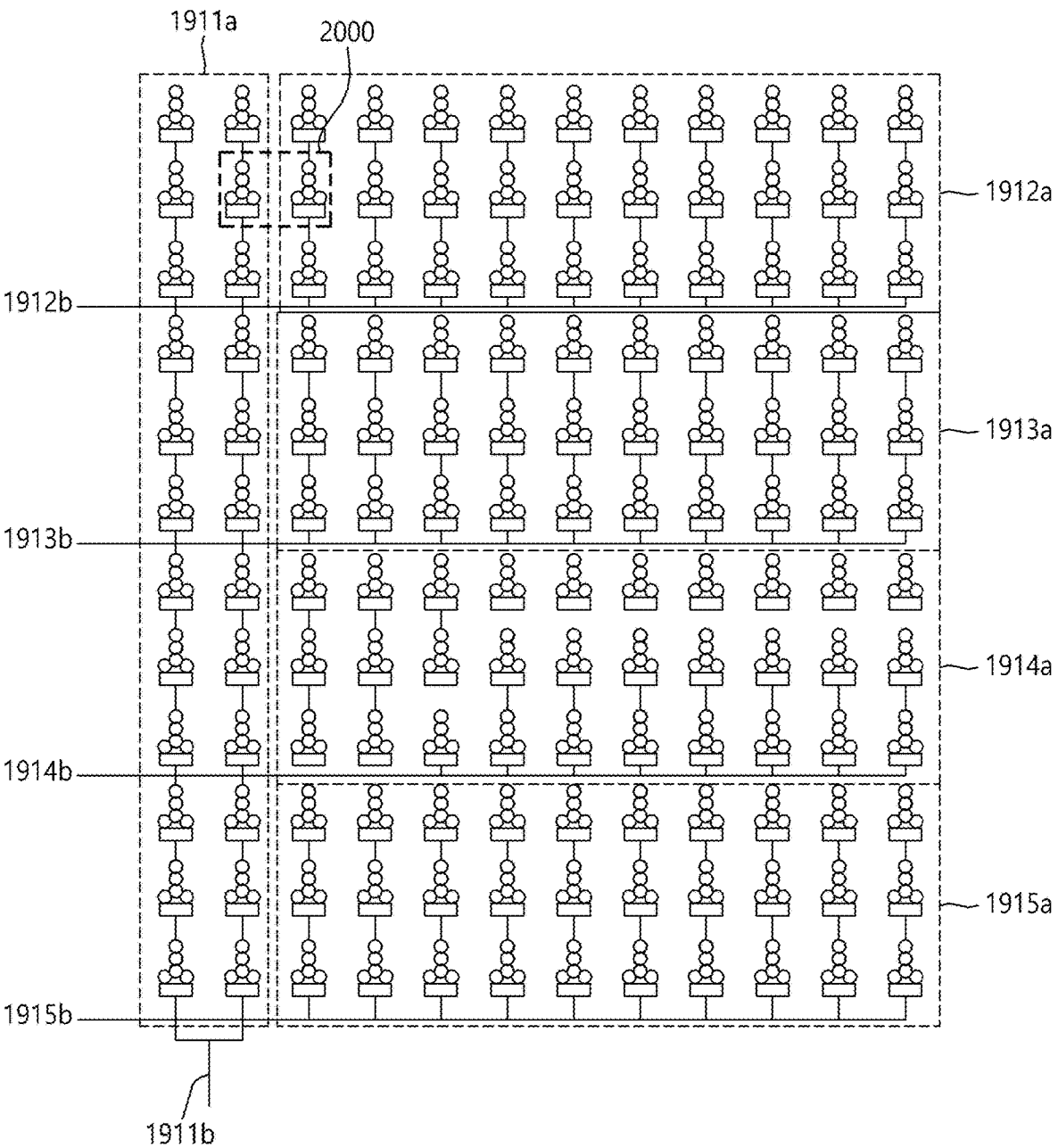

FIGS. 18 and 19 illustrate a touch electrode according to embodiments of the present disclosure.

Figure 20:
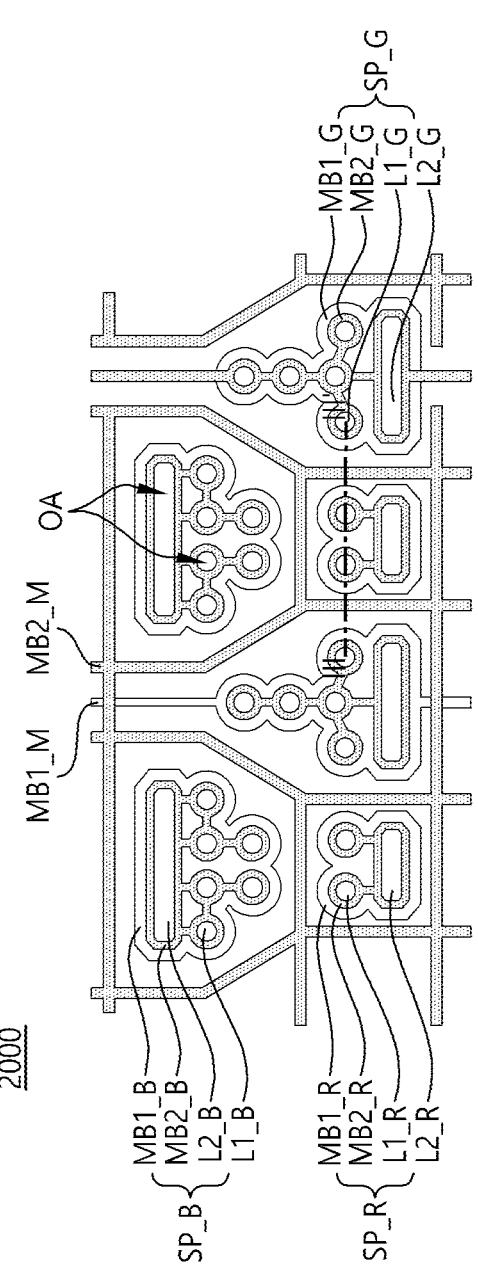
FIG. 20 is an enlarged area of one touch electrode illustrated in FIGS. 18 and 19.

FIG. 20 is an enlarged area of one touch electrode illustrated in FIGS. 18 and 19.

Figure 21:
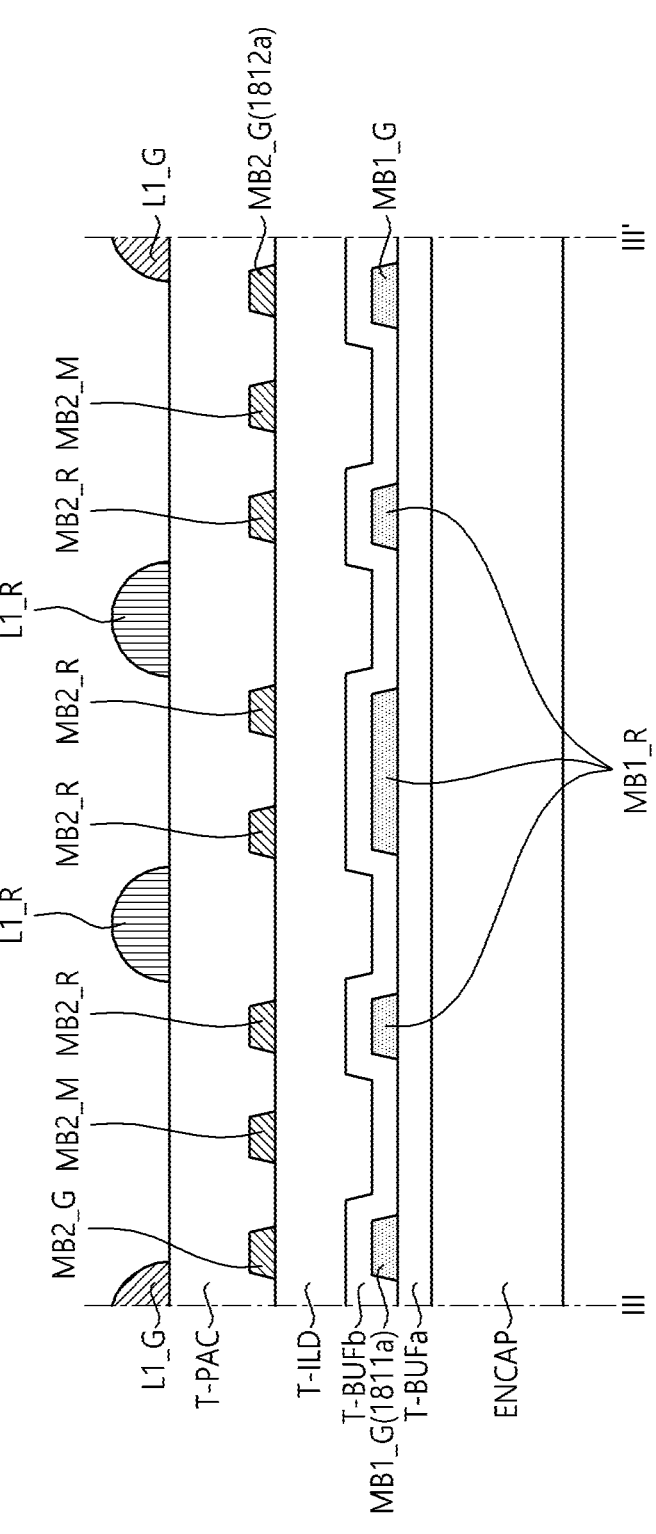
FIGS. 21 and 22 are cross-sectional views of an III-III' area of the touch electrode illustrated in FIG. 20.
Figure 22:
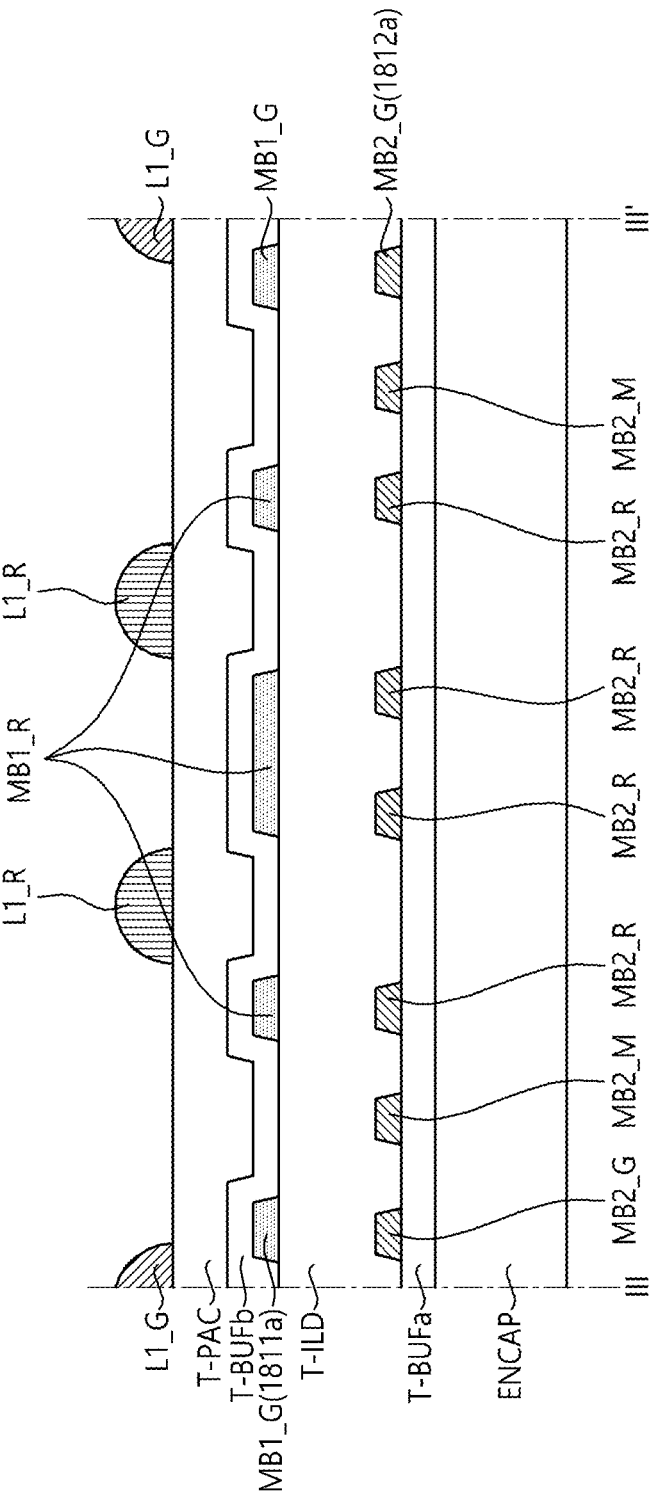

FIGS. 21 and 22 are cross-sectional views of an III-III' area of the touch electrode illustrated in FIG. 20.

Referring to FIG. 18, the arrangement of the plurality of touch electrodes 1811a, 1812a, 1813a, 1814a and 1815a, the arrangement of the plurality of touch routing lines 1811b, 1812b, 1813b, 1814b and 1815b, and the arrangement of the dummy metal barrier DMB can be the same as the arrangement of the plurality of touch electrodes 1411a, 1412a, 1413a, 1414a and 1415a and the arrangement of the plurality of touch routing lines 1411b, 1412b, 1413b, 1414b and 1415b illustrated in FIG. 15.

Referring to FIG. 19, the dummy metal barrier DM may not be disposed in FIG. 19. The dummy metal barriers MB can be included in the touch electrodes 1911a, 1912a, 1913a, 1914a and 1915a disposed in the same row as the corresponding dummy metal barriers DM. For example, the dummy metal barrier DM disposed in a second row illustrated in FIG. 18 can be included in a third touch electrode 1913a in FIG. 19. For example, the dummy metal barrier DM disposed in a third row illustrated in FIG. 18 can be included in a fourth touch electrode 1914a in FIG. 19.

A first touch routing line 1911b can be disposed to extend in the vertical direction.

A second touch routing line 1912b, a third touch routing line 1913b, a fourth touch routing line 1914b, and a fifth touch routing line 1915b can be disposed to extend in a horizontal direction.

Each of the second touch routing line 1912b, the third touch routing line 1913b, the fourth touch routing line 1914b, and the fifth touch routing line 1915b can overlap with the first touch routing line 1911b. Since each of the second touch routing line 1912b, the third touch routing line 1913b, the fourth touch routing line 1914b, and the fifth touch routing line 1915b is disposed on a different layer from the first touch routing line 1911b, each of the second touch routing line 1912b, the third touch routing line 1913b, the fourth touch routing line 1914b, and the fifth touch routing line 1915b can be disposed spaced apart from the first touch routing line 1911b.

Referring to FIG. 18 and FIG. 19, there is illustrated an area 2000 where one metal barrier MB1 included in the first touch electrode 1811a and 1911a, and one metal barrier MB1 included in the second touch electrode 1812a and 1912a are disposed. FIG. 20 illustrates an enlarged plan view of an area 2000 where one metal barrier MB1 included in the first touch electrode 1811a and 1911a, and one metal barrier MB1 included in the second touch electrode 1812a and 1912a are disposed.

Referring to FIG. 20, a plurality of blue subpixels SP_B can emit blue light. The plurality of blue subpixels SP_B can include a first lens L1_B, a second lens L2_B, a first metal barrier MB1_B, and a second metal barrier MB2_B.

A plurality of green subpixels SP_G can emit green light. The plurality of green subpixels SP_G can include a first lens L1_G, a second lens L2_G, a first metal barrier MB1_G, and a second metal barrier MB2_G.

A plurality of red subpixels SP_R can emit red light. A plurality of red subpixels SP_R can include a first lens L1_R, a second lens L2_R, a first metal barrier MB1_R, and a second metal barrier MB2_R.

The subpixels SP_R, SP_G and SP_B can include a first metal barrier MB1_R, MB1_G and MB1_B.

The subpixels SP_R, SP_G and SP_B can include a portion MB2_R, MB2_G and MB2_B of a second metal barrier MB2.

Another part MB2_M of the second metal barrier MB2 can be not included in the subpixels SP_R, SP_G and SP_B, and can be disposed in an area between a plurality of subpixels SP_R, SP_G and SP_B. Referring to FIG. 20, another part MB2_M of the second metal barrier MB2 can be composed of a plurality of metal lines arranged like a spider web.

The second metal barrier MB2_M not included in the subpixels SP_R, SP_G and SP_B may not be electrically connected to the second metal barriers MB2_R, MB2_G and MB2_B included in the subpixels SP_R, SP_G and SP_B.

The first metal barrier MB1_G included in the green subpixel SP_G can be disposed to extend to an area outside the green subpixel SP_G. As the first metal barrier MB1_G included in the green subpixel SP_G is arranged to extend to an area outside the green subpixel SP_G, the first touch electrodes 1811a and 1911a illustrated in FIGS. 18 and 19 can be electrically connected to each other.

The second metal barrier MB2_G included in the green subpixel SP_G can be disposed to extend to an area outside the green subpixel SP_G. As the second metal barrier MB2_G included in the green subpixel SP_G is arranged to extend beyond the area outside the green subpixel SP_G, the second touch electrodes 1812a and 1912a illustrated in FIGS. 18 and 19 can be electrically connected to each other. Referring to FIG. 20, the second metal barrier MB2_G included in the green subpixel SP_G can be disposed to be spaced apart from the surrounding second metal barriers MB2_G.

There is illustrated the III-III' area. FIG. 21 illustrates a cross-sectional view of the III-III' area of FIG. 20.

Referring to FIG. 21, a first touch buffer film T-BUFa can be disposed on an encapsulation layer ENCAP.

The first metal barrier MB1_R included in the red subpixel SP_R and the first metal barrier MB1_G included in the green subpixel SP_G can be disposed on the first touch buffer film T-BUFa.

A second touch buffer film T-BUFb can be disposed to cover the first touch buffer film T-BUFa and the first metal barriers MB1.

A touch interlayer insulating film T-ILD can be disposed to cover the second touch buffer film T-BUFb.

The second metal barriers MB2_R, MB2_M and MB2_G can be disposed on the touch interlayer insulating film T-ILD.

The second metal barrier MB2_R included in the red subpixel SP_R can be disposed on the touch interlayer insulating film T-ILD.

The second metal barrier MB2_G included in the green subpixel SP_G can be disposed on the touch interlayer insulating film T-ILD.

The second metal barrier MB2_M not included in the subpixels SP_R, SP_G and SP_B can be disposed on the touch interlayer insulating film T-ILD.

Based on the cross-sectional view, each of the second metal barriers MB2_R, MB2_M and MB2_G can be disposed to be spaced apart from each other.

A protective film T-PAC can be disposed to cover the second metal barriers MB2_R, MB2_M and MB2_G.

Some 1811a of the first metal barriers MB1 can be part of the first touch electrode 1811a illustrated in FIG. 18. In addition, referring to FIG. 21, some 1811a of the first metal barriers MB1 can be part of the first touch electrode 1911a illustrated in FIG. 19. For example, the first metal barrier MB1_G illustrated on the far left in FIG. 21 can be the first touch electrode 1811a illustrated in FIG. 18. The first metal barrier MB1_G illustrated on the far left in FIG. 21 can be the first touch electrode 1911a illustrated in FIG. 19.

Some 1812a of the second metal barriers MB2 can be part of the second touch electrode 1812a illustrated in FIG. 18. In addition, referring to FIG. 21, some 1812a of the second metal barriers MB2 can be part of the second touch electrode 1912a illustrated in FIG. 19. For example, the second metal barrier MB2_G illustrated on the rightmost side in FIG. 21 can be part of the second touch electrode 1812a illustrated in FIG. 18. The second metal barrier MB2_G illustrated on the rightmost side in FIG. 21 can be part of the second touch electrode 1912a illustrated in FIG. 19.

The first lenses L1_R and L1_G can be disposed on the protective film T-PAC. The light incident on the first lens L1_R and L1_G can be emitted at a predetermined angle after passing through the first lens L1_R and L1_G. When the light passes through the first lenses L1_R and L1_G, the viewing angle of the light passing through the first lenses L1_R and L1_G can be relatively small or narrow.

The first lens L1_R included in the red subpixel SP_R can be disposed on the protective film T-PAC. Based on the cross-sectional view, a part of the first lens L1_R included in the red subpixel SP_R can be disposed to overlap with a part of the first metal barrier MB1_R and a part of the second metal barrier MB2_R. However, a part of the first lens L1_R can be disposed so as not to overlap with a part of the first metal barrier MB1_R and a part of the second metal barrier MB2_R.

The first lens L1_G included in the green subpixel SP_G can be disposed on the protective film T-PAC. Based on the cross-sectional view, a part of the first lens L1_G included in the green subpixel SP_G can be disposed so as to overlap with a part of the first metal barrier MB1_G and a part of the second metal barrier MB2_G. However, a part of the first lens L1_G can be disposed so as not to overlap with a part of the first metal barrier MB1_G and a part of the second metal barrier MB2_G.

Referring to FIGS. 20 and 21, the first metal barrier MB1 and the second metal barrier MB2 can provide a light shielding function. Referring to FIGS. 18 and 19, the first metal barrier MB1 and the second metal barrier MB2 can serve as touch electrodes. For example, the first metal barrier MB1 and the second metal barrier MB2 can serve as a light shielding member while also serving as a touch electrode. In addition, since touch operation is possible without a contact hole being arranged between the first metal barrier MB1 and the second metal barrier MB2, there can be thinner a layer on which the touch electrode is disposed.

Referring to FIG. 21, the second metal barrier MB2 can be disposed in different layers from the first metal barrier MB1. Since no contact hole is formed between the first metal barrier MB1 and the second metal barrier MB2, the first metal barrier MB1 and the second metal barrier MB2 can be arranged with their positions swapped.

Referring to FIG. 22, the second metal barriers MB2_G and MB2_R illustrated in FIG. 22 can play the same role as the first metal barriers MB1_G and MB1_R illustrated in FIG. 21, and the first metal barriers MB1_G and MB1_R illustrated in FIG. 22 can play the same role as the second metal barriers MB2_G, MB2_R and MB2_M illustrated in FIG. 21. The second metal barrier MB2_G and MB2_R illustrated in FIG. 22 can be disposed at a lower position than the first metal barrier MB1_G and MB1_R illustrated in FIG. 22.

Hereinafter, it will be described another embodiment of the metal barrier MB1 which simultaneously functions as a light shield member and a touch electrode.

Figure 23:
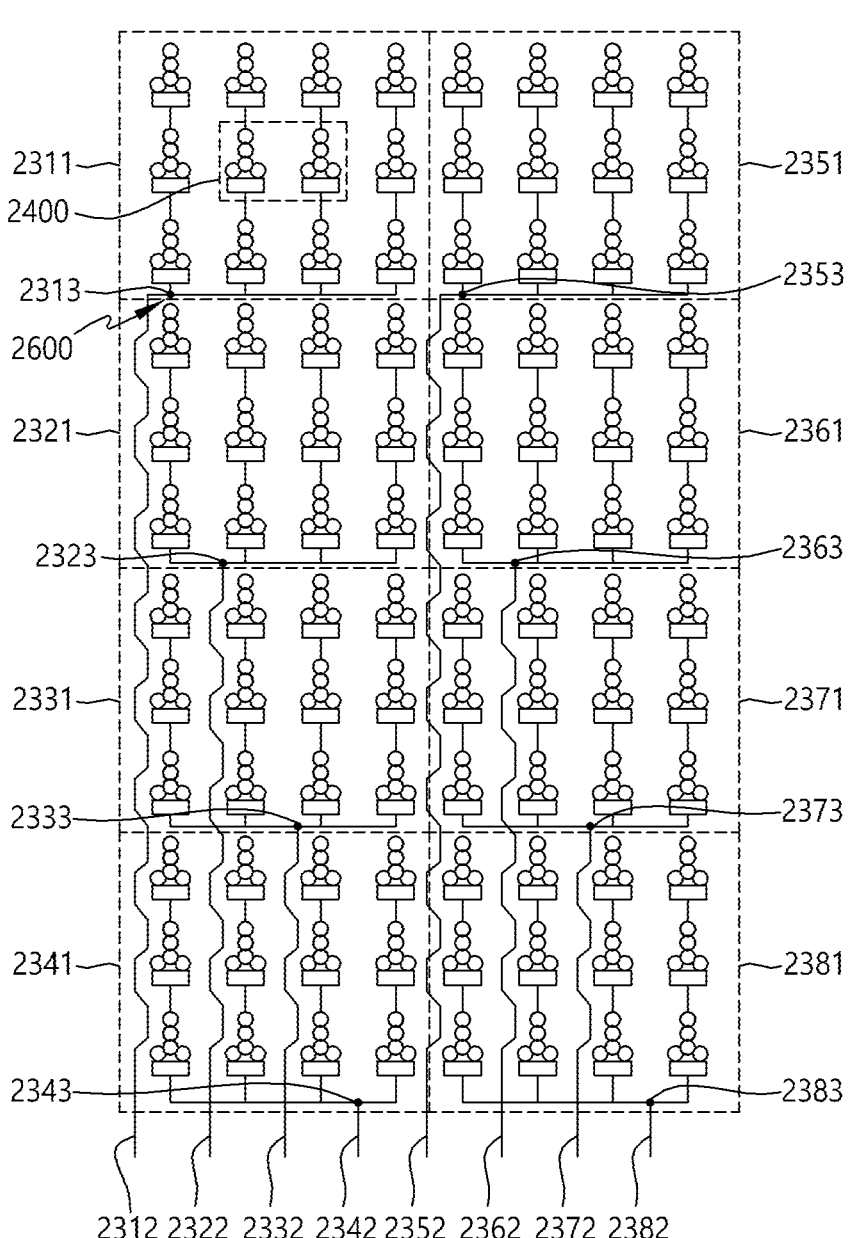
FIG. 23 is illustrates a touch electrode according to embodiments of the present disclosure.

FIG. 23 illustrates a touch electrode according to embodiments of the present disclosure.

Figure 24:
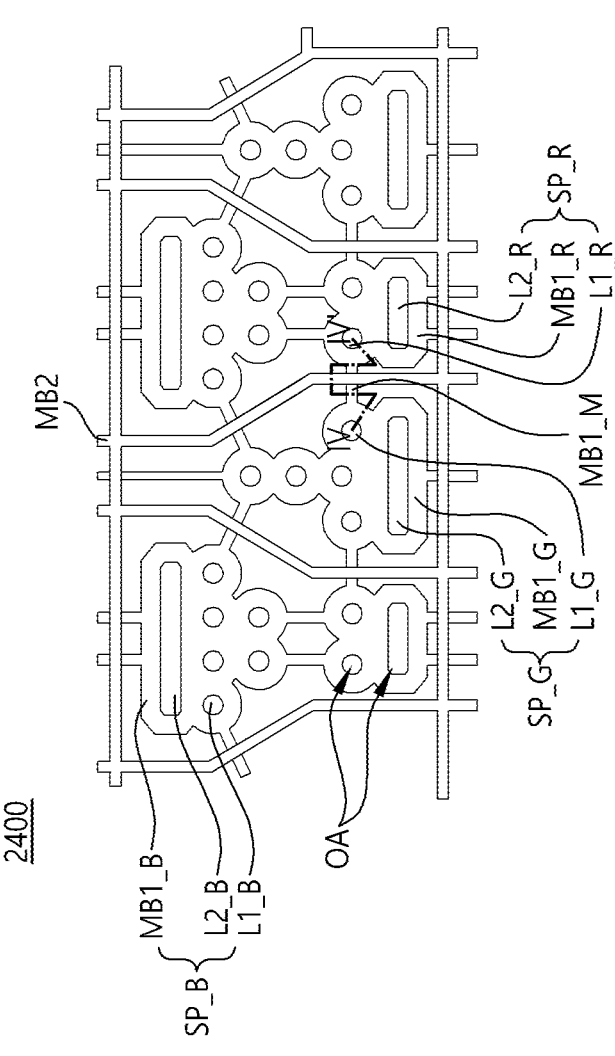
FIG. 24 is an enlarged area of one touch electrode illustrated in FIG. 23.

FIG. 24 is an enlarged area of one touch electrode illustrated in FIG. 23.

Figure 25:
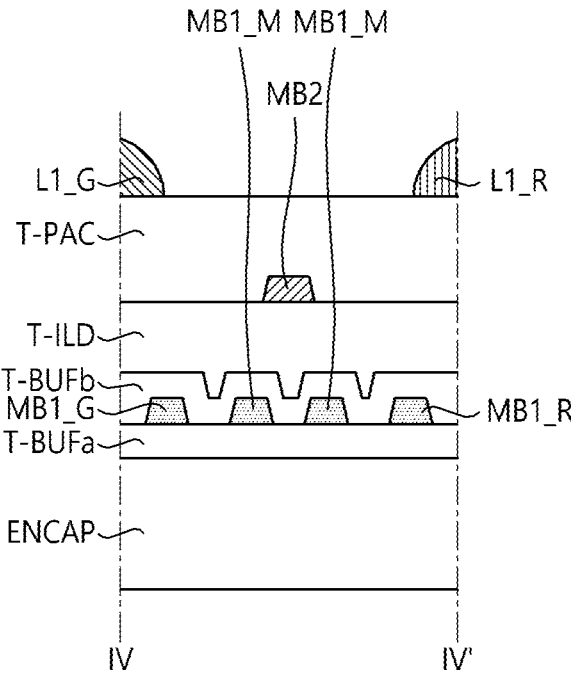
FIG. 25 is a cross-sectional view of an IV-IV' area of the touch electrode illustrated in FIG. 24.

FIG. 25 is a cross-sectional view of an IV-IV' area of the touch electrode illustrated in FIG. 24.

Figure 26:
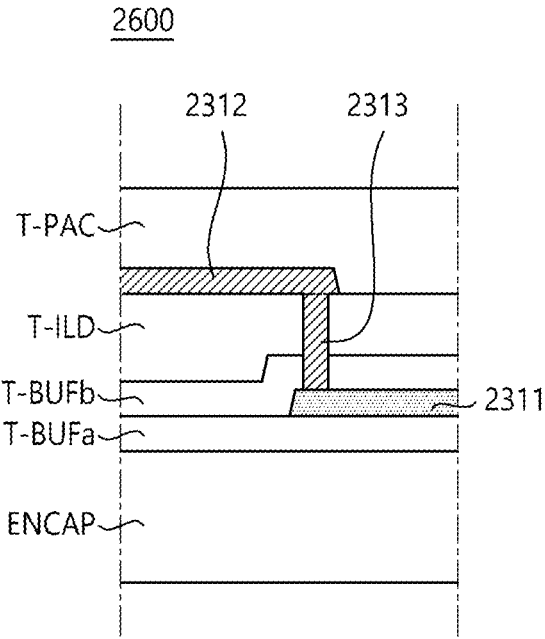
FIG. 26 is a cross-sectional view of a first contact electrode illustrated in FIG. 23.

FIG. 26 is a cross-sectional view of a first contact electrode illustrated in FIG. 23.

Referring to FIG. 23, there are illustrated eight areas divided by dotted lines. The eight areas can correspond to touch electrodes. The eight areas can be arranged in four rows and two columns.

A first touch electrode 2311 can be disposed at a position corresponding to a first row and a first column. The first touch electrode 2311 can be electrically connected through a first touch routing line 2312 and a first contact electrode 2313.

A second touch electrode 2321 can be disposed at a position corresponding to a second row and the first column. The second touch electrode 2321 can be electrically connected through a second touch routing line 2322 and a second contact electrode 2323.

A third touch electrode 2331 can be disposed at a position corresponding to a third row and the first column. The third touch electrode 2331 can be electrically connected through a third touch routing line 2332 and a third contact electrode 2333.

A fourth touch electrode 2341 can be disposed at a position corresponding to a fourth row and the first column. The fourth touch electrode 2341 can be electrically connected through a fourth touch routing line 2342 and a fourth contact electrode 2343.

A fifth touch electrode 2351 can be disposed at a position corresponding to a first row and the second column. The fifth touch electrode 2351 can be electrically connected through a fifth touch routing line 2352 and a fifth contact electrode 2353.

A sixth touch electrode 2361 can be disposed at a position corresponding to a second row and the second column. The sixth touch electrode 2361 can be electrically connected through a sixth touch routing line 2362 and a sixth contact electrode 2363.

A seventh touch electrode 2371 can be disposed at a position corresponding to a third row and the second column. The seventh touch electrode 2371 can be electrically connected through a seventh touch routing line 2372 and a seventh contact electrode 2373.

An eighth touch electrode 2381 can be disposed at a position corresponding to a fourth row and the second column. The eighth touch electrode 2381 can be electrically connected through an eighth touch routing line 2382 and an eighth contact electrode 2383.

Since each of the touch electrodes 2311, 2321, 2331, 2341, 2351, 2361, 2371 and 2381 is driven individually, the display device can sense a touch through a self-capacitance-based touch sensing method.

In addition, the display device can sense a touch through a mutual-capacitance-based touch sensing method. In this case, the first touch electrode 2311, the second touch electrode 2321, the third touch electrode 2331, and the fourth touch electrode 2341 can be driving touch electrodes. The fifth touch electrode 2351, the sixth touch electrode 2361, the seventh touch electrode 2371, and the eighth touch electrode 2381 can be sensing touch electrodes.

The above-described touch sensing method is only an example, and the display device can sense a touch by using the touch electrodes 2311, 2321, 2331, 2341, 2351, 2361, 2371 and 2381, and the touch routing lines 2312, 2322, 2332, 2342, 2352, 2362, 2372 and 2382 illustrated in FIG. 23.

There is illustrated an area 2400 indicating two metal barriers MB1 included in the first touch electrode 2311. FIG. 24 illustrates an enlarged plan view of an area 2400 indicating two metal barriers MB1 included in the first touch electrode 2311.

Referring to FIG. 24, a plurality of blue subpixels SP_B can emit blue light. The plurality of blue subpixels SP_B can include a first lens L1_B, a second lens L2_B, and a first metal barrier MB1_B.

A plurality of green subpixels SP_G can emit green light. The plurality of green subpixels SP_G can include a first lens L1_G, a second lens L2_G, a first metal barrier MB1_G, and a second metal barrier MB2_G.

A plurality of red subpixels SP_R can emit red light. A plurality of red subpixels SP_R can include a first lens L1_R, a second lens L2_R, a first metal barrier MB1_R, and a second metal barrier MB2_R.

The subpixels SP_R, SP_G and SP_B can include a first metal barrier MB1.

The subpixels SP_R, SP_G can SP_B can include a part of a second metal barrier MB2.

Another part MB2 of the second metal barrier MB2 may not be included in the subpixels SP_R, SP_G and SP_B, and can be disposed in an area between the plurality of subpixels SP_R, SP_G and SP_B. Referring to FIG. 24, the second metal barrier MB2 can be composed of a plurality of metal lines arranged like a spider web.

The first metal barriers MB1_R, MB1_G and MB1_B disposed adjacent to each other can be electrically connected to each other through the extended portion MB1_M of the first metal barriers MB1.

The first metal barrier MB1_B included in the blue subpixel SP_B can be electrically connected to the adjacent first metal barriers MB1_G and MB1_R through the extended portion MB1_M of six first metal barriers MB1.

The first metal barrier MB1_R included in the red subpixel SP_R can be electrically connected to adjacent first metal barriers MB1_G and MB1_B through the extended portions MB1_M of six first metal barrier MB1.

The first metal barrier MB1_G included in the green subpixel SP_G can be electrically connected to the adjacent first metal barriers MB1_B and MB1_R through the extended portion MB1_M of the six first metal barrier MB1.

There is illustrated the IV-IV' area. FIG. 25 illustrates a cross-sectional view of the IV-IV' area.

Referring to FIG. 25, a first touch buffer film T-BUF can be disposed on an encapsulation layer ENCAP.

The first metal barrier MB1_R included in the red subpixel SP_R, the first metal barrier MB1_G included in the green subpixel SP_G, and an extended portion MB1_M of the first metal barrier MB1 can be disposed on the first touch buffer film T-BUF.

A second touch buffer film T-BUF can be disposed to cover the first touch buffer film T-BUF and the first metal barriers MB1_G, MB1_R and MB1_M.

A touch interlayer insulating film T-ILD can be disposed to cover the second touch buffer film T-BUF.

The second metal barrier MB2 can be disposed on the touch interlayer insulating film T-ILD.

A protective film T-PAC can be disposed to cover the second metal barrier MB2.

The first lenses L1_R and L1_G can be disposed on the protective film T-PAC. Light incident on the first lens L1_R and L1_G can be emitted at a predetermined angle after passing through the first lens L1_R and L1_G. When the light passes through the first lenses L1_R and L1_G, the viewing angle of the light passing through the first lenses L1_R and L1_G can be relatively small or narrow.

The first lens L1_R included in the red subpixel SP_R can be disposed on the protective film T-PAC. Based on the cross-sectional view, a part of the first lens L1_R included in the red subpixel SP_R can be disposed to overlap with a part of the first metal barrier MB1_R. However, a part of the first lens L1 can be disposed so as not to overlap with a part of the first metal barrier MB1.

The first lens L1_G included in the green subpixel SP_G can be disposed on the protective film T-PAC. When viewed from the cross-sectional view, a part of the first lens L1_G included in the green subpixel SP_G can be disposed so as to overlap with a part of the first metal barrier MB1_G. However, a part of the first lens L1 can be disposed so as not to overlap with a part of the first metal barrier MB1.

Referring to FIG. 26, there is illustrated a cross-sectional view of the first contact electrode 2313 illustrated in FIG. 23.

A first touch electrode 2311 can be disposed on the first touch buffer film T-BUFa.

A second touch buffer film T-BUFb can be disposed on the first touch buffer film T-BUFa.

A touch interlayer insulating film T-ILD can be disposed on the second touch buffer film T-BUFb.

A first touch routing line 2312 can be disposed on the touch interlayer insulating film T-ILD.

The first touch routing line 2312 can be electrically connected to the first touch electrode 2311 through a first contact electrode 2313. The first contact electrode 2313 can be disposed in a contact hole formed in the touch interlayer insulating film T-ILD and the second touch buffer film T-BUFb.

The protective film T-PAC can be disposed to cover the first touch routing line 2312.

Referring to FIGS. 25 and 26, the first metal barrier MB1 and the second metal barrier MB2 can serve as light shielding member. Referring to FIG. 23, the first metal barrier MB1 and the second metal barrier MB2 can serve as touch electrodes. For example, the first metal barrier MB1 and the second metal barrier MB2 can function as touch electrodes while also serving as light shielding member. Referring to FIG. 24, since adjacent first metal barriers MB1 can be electrically connected to each other, the touch electrodes 2311, 2321, 2331, 2341, 2351, 2361, 2371 and 2381 formed of the first metal barrier MB1 can be arranged more densely. Therefore, even if the gap between the subpixels SP_R, SP_G and SP_B is relatively small, the touch operation can be performed normally.

Figure 27:
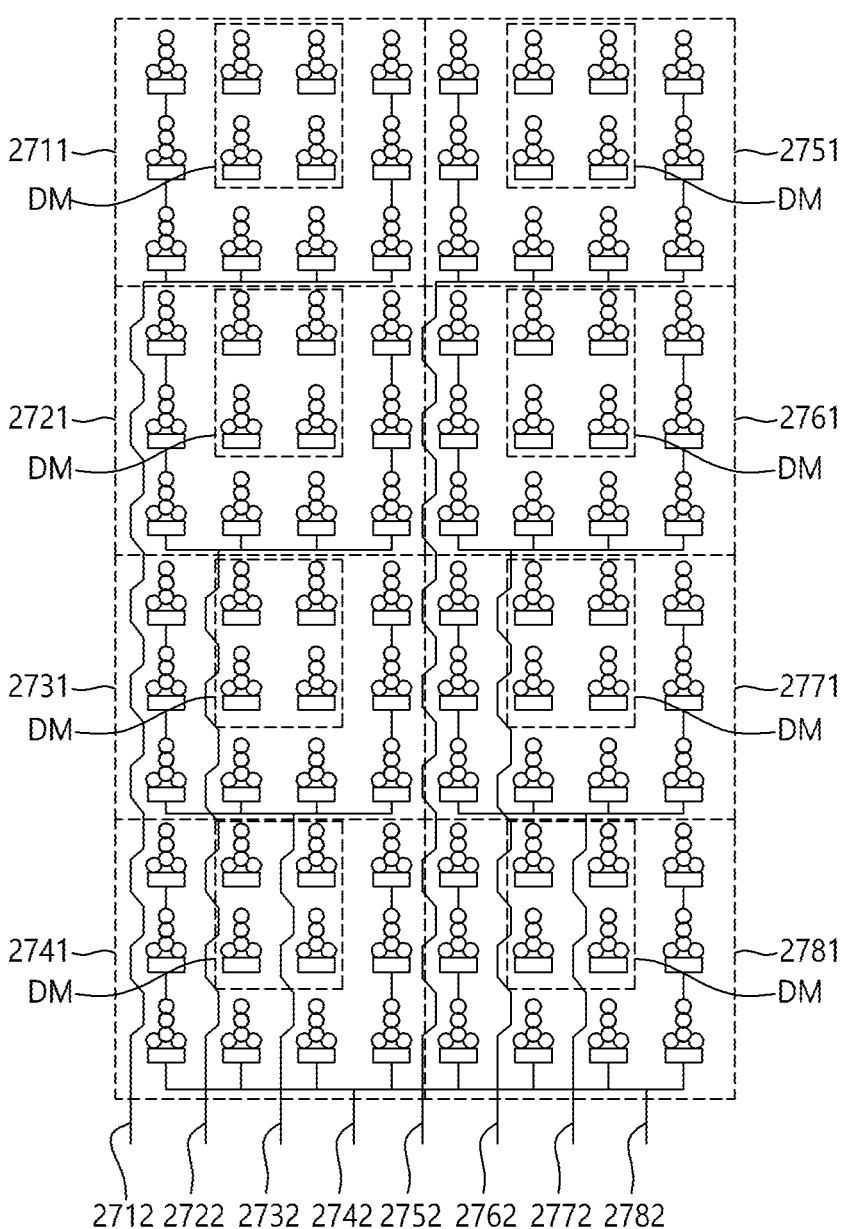
FIG. 27 illustrates the touch electrode illustrated in FIG. 23 with a dummy metal added thereto.

FIG. 27 illustrates the touch electrode illustrated in FIG. 23 with a dummy metal DM added thereto.

Referring to FIG. 27, based on the plan view, the dummy metal DM may be disposed on the inner side of the touch electrodes 2711, 2721, 2731, 2741, 2751, 2761, 2771 and 2781.

The dummy metal DM can be formed of four first metal barriers MB1. The first touch electrode 2711 can be formed of eight first metal barriers MB1, and the dummy metal DM can be disposed on the inner side of the eight first metal barriers MB1.

The dummy metal DM can be disposed on the inner side of the first touch electrode 2711. In addition, the dummy metal DM can be disposed on the inner side of each of the second touch electrode 2721, the third touch electrode 2731, the fourth touch electrode 2741, the fifth touch electrode 2751, the sixth touch electrode 2761, the seventh touch electrode 2771, and the eighth touch electrode 2781.

Embodiments of the present disclosure described above are briefly described as follows.

A display device according to embodiments of the present disclosure can include a substrate, an encapsulation layer disposed on the substrate, a metal barrier including an opening area, and constituting a touch electrode, and a first lens disposed to overlap with the opening area of the metal barrier.

The display device according to embodiments of the present disclosure can further include a first touch buffer film disposed on the encapsulation layer, a first metal barrier disposed on the first touch buffer film, a second touch buffer film disposed to cover the first metal barrier, and a touch interlayer insulating film disposed between the first metal barrier and the second metal barrier which is the metal barrier.

The metal barrier included in a first subpixel can be disposed to extend to a second subpixel.

The metal barrier can include an extended portion extending to the second subpixel, and a portion disposed spaced apart from the extended portion.

The display device according to embodiments of the present disclosure can further include a second lens disposed to overlap with the opening area of the metal barrier The number of the first lenses disposed to overlap with the opening area of the metal barrier can be greater than the number of the second lenses disposed to overlap with the opening area of the metal barrier.

The first subpixel can include a driving transistor, a first light emitting device electrically connected to the driving transistor and disposed to overlap with the first lens, and a second light emitting device electrically connected to the driving transistor and disposed to overlap with the second lens. The light can be emitted from the first subpixel when either the first light emitting device or the second light emitting device emits light.

The viewing angle of light emitted through the first lens can be smaller than the viewing angle of light emitted through the second lens.

The display device according to embodiments of the present disclosure can further include a first touch electrode as the touch electrode including the metal barrier and disposed to extend in a first direction, a second touch electrode including the metal barrier and disposed to extend in a second direction intersecting the first direction, and a dummy metal including the metal barrier and disposed to be electrically separated from the first touch electrode and the second touch electrode.

The display device according to embodiments of the present disclosure can further include a third touch electrode including the metal barrier and disposed to extend in the second direction. In this case, a length of the third touch electrode in the second direction can be smaller than a length of the second touch electrode in the second direction, and the dummy metal can be disposed between the first touch electrode and the third touch electrode.

The display device according to embodiments of the present disclosure can further include a touch routing line electrically connected to the second touch electrode and disposed between the first touch electrode and the dummy metal.

The display device according to embodiments of the present disclosure can further include a first touch buffer film disposed on the encapsulation layer, a touch interlayer insulating film disposed on a first metal barrier which is the metal barrier, and a second metal barrier disposed on the touch interlayer insulating film.

The display device according to embodiments of the present disclosure can further include a first touch electrode as the touch electrode including the first metal barrier and disposed to extend in a first direction, and a second touch electrode including the second metal barrier and disposed to extend in a second direction intersecting the first direction.

The display device according to embodiments of the present disclosure can further include a first touch routing line electrically connected to the first touch electrode and disposed to extend in the first direction, and a second touch routing line electrically connected to the second touch electrode and disposed to extend in the first direction.

The display device according to embodiments of the present disclosure can further include a first touch routing line electrically connected to the first touch electrode and disposed to extend in the first direction, and a second touch routing line electrically connected to the second touch electrode and disposed to extend in the second direction.

A portion of the second touch routing line can be disposed to overlap with the first touch routing line.

The display device according to embodiments of the present disclosure can further include a first touch buffer film disposed on the encapsulation layer, a touch interlayer insulating film disposed on the first metal barrier which is the metal barrier, and a second metal barrier disposed on the touch interlayer insulating film and being able to be configured as a touch routing line electrically connected to the touch electrode.

The display device according to embodiments of the present disclosure can further include a contact electrode disposed in contact with the touch electrode and the touch routing line.

The display device according to embodiments of the present disclosure can further include a second touch electrode disposed in the same column as the first touch electrode which is the touch electrode, and a third touch electrode disposed in the same row as the first touch electrode.

The display device according to embodiments of the present disclosure can further include a dummy metal disposed on an inner side of the first touch electrode while being electrically separated from the first touch electrode.

The above description and the accompanying drawings provide an example of the technical idea of the present disclosure for illustrative purposes only. Various modifications, additions and substitutions to the described embodiments will be readily apparent to those skilled in the art without departing from the spirit and scope of the present disclosure. In addition, the disclosed embodiments are intended to illustrate the scope of the technical idea of the present disclosure. Thus, the scope of the present disclosure is not limited to the embodiments shown.

What is claimed is:

1. A display device comprising:
a substrate;
an encapsulation layer disposed on the substrate;
a metal barrier including an opening area, and constituting a touch electrode;
a first lens disposed to overlap with the opening area of the metal barrier; and
a first subpixel and a second subpixel disposed on the substrate,
wherein the metal barrier included in the first subpixel is disposed to extend to the second subpixel.

2. The display device of claim 1, further comprising:
a first touch buffer film disposed on the encapsulation layer;
a first metal barrier disposed on the first touch buffer film;

a second touch buffer film covering the first metal barrier; and
a touch interlayer insulating film disposed between the first metal barrier and a second metal barrier being the metal barrier including the opening area.

3. The display device of claim 1, wherein the metal barrier includes an extended portion extending to the second subpixel, and a portion disposed spaced apart from the extended portion.

4. The display device of claim 3, further comprising a second lens disposed to overlap with the opening area of the metal barrier.

5. The display device of claim 4, wherein a number of first lenses disposed to overlap with the opening area of the metal barrier is greater than a number of second lenses disposed to overlap with the opening area of the metal barrier.

6. The display device of claim 4, wherein the first subpixel includes a driving transistor, a first light emitting device electrically connected to the driving transistor and disposed to overlap with the first lens, and a second light emitting device electrically connected to the driving transistor and disposed to overlap with the second lens, and
wherein light is emitted from the first subpixel when either the first light emitting device or the second light emitting device emits light.

7. The display device of claim 4, wherein the first lens has a hemispherical shape, and the second lens has a semi-cylindrical shape.

8. The display device of claim 1, further comprising:
a first touch electrode as the touch electrode including the metal barrier and disposed to extend in a first direction;
a second touch electrode including the metal barrier and disposed to extend in a second direction intersecting the first direction; and
a dummy metal including the metal barrier and disposed to be electrically separated from the first touch electrode and the second touch electrode.

9. The display device of claim 8, further comprising a third touch electrode including the metal barrier and disposed to extend in the second direction,
wherein a length of the third touch electrode in the second direction is smaller than a length of the second touch electrode in the second direction, and
wherein the dummy metal is disposed between the first touch electrode and the third touch electrode.

10. The display device of claim 8, further comprising a touch routing line electrically connected to the second touch electrode and disposed between the first touch electrode and the dummy metal.

* * * * *